(12) United States Patent
Aota

(10) Patent No.: US 7,208,931 B2
(45) Date of Patent: Apr. 24, 2007

(54) CONSTANT CURRENT GENERATING CIRCUIT USING RESISTOR FORMED OF METAL THIN FILM

(75) Inventor: Hideyuki Aota, Hyogo (JP)

(73) Assignee: Ricoh Company, Ltd. (JP)

( * ) Notice: Subject to any disclaimer, the term of this patent is extended or adjusted under 35 U.S.C. 154(b) by 72 days.

(21) Appl. No.: 11/115,150

(22) Filed: Apr. 27, 2005

(65) Prior Publication Data

US 2005/0248397 A1  Nov. 10, 2005

(30) Foreign Application Priority Data

May 7, 2004  (JP) .............................. 2004-138300

(51) Int. Cl.
*G05F 3/20* (2006.01)
*G05F 3/02* (2006.01)

(52) U.S. Cl. ...................................... 323/315; 327/541

(58) Field of Classification Search ................ 323/315, 323/314, 313; 327/539, 541
See application file for complete search history.

(56) References Cited

U.S. PATENT DOCUMENTS

| | | | | |
|---|---|---|---|---|
| 3,862,017 A | * | 1/1975 | Tsunemitsu et al. | 205/124 |
| 4,947,020 A | * | 8/1990 | Imamura et al. | 219/121.65 |
| 5,038,053 A | * | 8/1991 | Djenguerian et al. | 327/513 |
| 5,059,890 A | * | 10/1991 | Yoshikawa et al. | 323/315 |
| 5,910,749 A | * | 6/1999 | Kimura | 327/541 |
| 5,929,746 A | * | 7/1999 | Edwards et al. | 338/320 |
| 6,057,727 A | * | 5/2000 | Dautriche et al. | 327/543 |
| 6,087,820 A | * | 7/2000 | Houghton et al. | 323/315 |
| 6,274,452 B1 | * | 8/2001 | Miura et al. | 438/384 |
| 6,437,550 B2 | * | 8/2002 | Andoh et al. | 323/315 |
| 6,657,423 B2 | * | 12/2003 | Tanizawa | 324/72 |
| 6,664,847 B1 | * | 12/2003 | Ye | 327/543 |
| 2004/0262709 A1 | * | 12/2004 | Yamashita et al. | 257/516 |

FOREIGN PATENT DOCUMENTS

JP    6-282338    10/1994

* cited by examiner

*Primary Examiner*—Karl Easthom
*Assistant Examiner*—Harry R Behm
(74) *Attorney, Agent, or Firm*—Dickstein Shapiro LLP

(57) ABSTRACT

A circuit for generating a constant current includes a reference voltage generating circuit configured to generate a reference voltage and a constant current circuit including one or more resistors configured to determine an amount of an electric current generated in response to the reference voltage, the one or more resistors being formed of a metal thin film.

11 Claims, 13 Drawing Sheets

CONSTANT CURRENT GENERATING CIRCUIT USING RESISTOR FORMED OF METAL THIN FILM

BACKGROUND OF THE INVENTION

1. Field of the Invention

The present invention relates to a constant current generating circuit for use in a portable phone or the like driven by a battery.

2. Description of the Related Art

Various types of constant current generating circuits have been designed to date. Patent Document 1 listed below, for example, discloses a constant current generating circuit comprised of a reference voltage generating circuit, an operational amplifier, and a current mirror circuit.

[Patent Document 1] Japanese Patent Application Publication No. 6-282338

The constant current generating circuit disclosed in Patent Document 1 adjusts a ratio S (=W/L) of a channel width W to a channel length L with respect to an enhance-type field effect transistor (hereinafter referred to as an FET) and a depletion-type FET provided in the reference voltage generating circuit. Trough this adjustment, the reference voltage is configured to have a negative coefficient such that the reference voltage decreases in response to an increase in ambient temperature. This negative coefficient cancels out a negative coefficient of a resistor made of polysilicon whose voltage decreases in response to an increase in ambient temperature. Hereinafter, a coefficient that specifies a voltage level responsive to an increase/decrease in ambient temperature is referred to as a temperature coefficient. When the voltage decreases in response to an increase in ambient temperature, for example, the temperature coefficient is a negative temperature coefficient. When the voltage increases in response to an increase in ambient temperature, on the other hand, the temperature coefficient is a positive temperature coefficient.

The constant current generating circuit as described above has three drawbacks as described in the following.

(1) An optimum ratio S of an enhance-type or depletion-type FET varies depending on the threshold of the FET. Because of this, it is difficult for a single set of FETs to generate a reference voltage that cancels out a negative temperature coefficient of a resistor.

(2) In order to obviate the above problem, the ratio S may be adjusted by use of laser trimming during a manufacturing step (after the diffusion and generating step). With this method, however, not only the temperature coefficient of the reference voltage but also the potential of the reference voltage is changed. For the purpose of using the circuit as a constant current generating circuit, therefore it becomes necessary to perform trimming also on the resistor made of polysilicon. This results in an undesirable increase in the circuit scale.

(3) The reference voltage generated by this constant voltage generating circuit has a negative temperature coefficient to cancel out the temperature coefficient of a resistor. If there is a need for a reference voltage that has a zero or substantially zero temperature coefficient, thus, it is necessary to provide another reference voltage.

Accordingly, there is a need for a constant current generating circuit that is robust against variation in the manufacturing process and that does not require trimming for adjusting the temperature coefficient to zero after the manufacturing. Also, there is a need for a reference voltage generating circuit that can generate a reference voltage having a zero or substantially zero temperature coefficient.

SUMMARY OF THE INVENTION

It is a general object of the present invention to provide a constant current generating circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a constant current generating circuit particularly pointed out in the specification in such full, clear, concise, and exact terms as to enable a person having ordinary skill in the art to practice the invention.

To achieve these and other advantages in accordance with the purpose of the invention, the invention provides a circuit for generating a constant current, which includes a reference voltage generating circuit configured to generate a reference voltage, and a constant current circuit including one or more resistors configured to determine an amount of an electric current generated in response to the reference voltage, the one or more resistors being formed of a metal thin film.

The constant current generating circuit described above uses a metal thin film for a resistor, so that a depletion layer and accumulation layer are less likely to develop compared to when polysilicon is used. This circuit can thus produce a stable constant current regardless of a change in ambient temperature and/or a change in the potential of a power for driving the circuit.

According to another aspect of the present invention, the reference voltage generating circuit includes a first power supply circuit configured to produce a first voltage having a positive temperature coefficient, the first power supply circuit including a plurality of field-effect transistors having respective gates, the gates having a common conduction type and different impurity densities, a slope adjusting circuit configured to adjust the positive temperature coefficient of the first voltage produced by the first power supply circuit, the slope adjusting circuit including a field effect transistor and at least one resistor, and a second power supply circuit configured to produce a second voltage having a negative temperature coefficient, to add the second voltage to the first voltage having the temperature coefficient thereof adjusted by the slope adjusting circuit, and thereby to produce the reference voltage having a substantially zero temperature coefficient, the second power supply circuit including a plurality of field-effect transistors having respective gates having different conduction types.

In the constant current generating circuit described above, the reference voltage generating circuit combines the circuits having negative and positive temperature coefficients in relation to a change in ambient temperature so as to cancel out the negative and positive temperature coefficients, thereby generating a reference voltage independent of temperature. This makes it possible to generate a reference voltage that is robust against process variation, accurate up to the upper/lower temperature limits of semiconductor operation, and stable with a small absolute value of the temperature coefficient. Because of this, a stable constant current can be generated without using a slope adjusting circuit for adjusting the temperature coefficient in the constant current circuit. Resisters connected in series in the slope adjusting circuit and the one or more resistors for determining an amount of an electric current generated in response to the reference voltage are formed of a metal thin film. Such resistors formed of a metal thin film are less likely to develop a depletion layer or accumulation layer, compared with a resistor formed of polysilicon. This makes it possible to generate a stable constant current regardless of a change in ambient temperature and/or a change in the potential of a power for driving the circuit.

According to another aspect of the present invention, said at least one resistor of the slope adjusting circuit is formed of a metal thin film.

In the constant current generating circuit described above, said at least one resistor of the slope adjusting circuit is formed of a metal thin film. It is thus less likely to develop a depletion layer or accumulation layer, compared with when polysilicon is used. This makes it possible to generate a stable constant current regardless of a change in ambient temperature and/or a change in the potential of a power for driving the circuit.

According to another aspect of the present invention, the metal thin film is made of silicon chrome.

In the constant current generating circuit described above, the metal thin film is made of silicon chrome. It is thus less likely to develop a depletion layer or accumulation layer, compared with when polysilicon is used. This makes it possible to generate a stable constant current regardless of a change in ambient temperature and/or a change in the potential of a power for driving the circuit.

According to another aspect of the present invention, the one or more resistors being formed of a metal thin film include a wiring pattern and an insulating film formed on the wiring pattern and configured to have a contact hole at a connection point of the wiring pattern, wherein the metal thin film is coupled through an ohmic contact to the connection point of the wiring pattern via the contact hole.

In the constant current generating circuit described above, the one or more resistors formed of a metal thin film include a wiring pattern and an insulating film formed on the wiring pattern and configured to have a contact hole at a connection point of the wiring pattern, wherein the metal thin film is coupled through an ohmic contact to the connection point of the wiring pattern via the contact hole. It is thus less likely to develop a depletion layer or accumulation layer, compared with when polysilicon is used as a resistor. This makes it possible to generate a stable constant current regardless of a change in ambient temperature and/or a change in the potential of a power for driving the circuit.

According to another aspect of the present invention, no natural oxide film is in existence on an inner wall of the contact hole and on a surface of the wiring pattern at a bottom of the contact hole.

In the constant current generating circuit described above, no natural oxide film is in existence on an inner wall of the contact hole and on a surface of the wiring pattern at a bottom of the contact hole, so that a change in resistance caused by a growth of an oxide film over time can be suppressed. In contrast with the configuration in which polysilicon is used as a resistor, it is possible to generate a stable constant current even after passage of time regardless of a change in ambient temperature and/or a change in the potential of a power for driving the circuit.

According to another aspect of the present invention, the circuit described above further includes a refractory metal film deposited between the metal thin film and the connection point of the wiring pattern.

In the constant current generating circuit described above, a refractory metal film is deposited between the metal thin film and the connection point of the wiring pattern, so that the resistance does not change upon exposure to heat at the time of manufacturing or due to heat generated during circuit operation.

According to another aspect of the present invention, the wiring pattern includes a metal material pattern and a refractory metal film formed on the metal material pattern.

In the constant current generating circuit described above, the wiring pattern includes a metal material pattern and a refractory metal film formed on the metal material pattern, so that the resistance does not change upon exposure to heat at the time of manufacturing or due to heat generated during circuit operation.

According to another aspect of the present invention, the wiring pattern includes a polysilicon pattern and a refractory metal film formed on the polysilicon pattern.

In the constant current generating circuit described above, the wiring pattern includes a polysilicon pattern and a refractory metal film formed on the polysilicon pattern, so that the resistance does not change upon exposure to heat at the time of manufacturing or due to heat generated during circuit operation.

According to another aspect of the present invention, the plurality of field-effect transistors of the second power supply circuit include a first field-effect transistor having an n-type gate and a second field-effect transistor having a p-type gate, the first field-effect transistor and the second field-effect transistor being connected in series.

According to another aspect of the present invention, the plurality of field-effect transistors of the first power supply circuit include a first field-effect transistor having a p-type gate doped with impurity at first density, and a second field-effect transistor having a p-type gate doped with impurity at second density different from the first density, the first field-effect transistor and the second field-effect transistor being connected in series.

According to another aspect of the present invention, the plurality of field-effect transistors of the first power supply circuit include a first field-effect transistor having an n-type gate doped with impurity at first density, and a second field-effect transistor having an n-type gate doped with impurity at second density different from the first density, the first field-effect transistor and the second field-effect transistor being connected in series.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

(1) First Embodiment

In the following, a description will be given of the configuration and operation of a constant current generating circuit 100 according to a first embodiment of the present invention with reference to the accompanying drawings.

Figure 1:
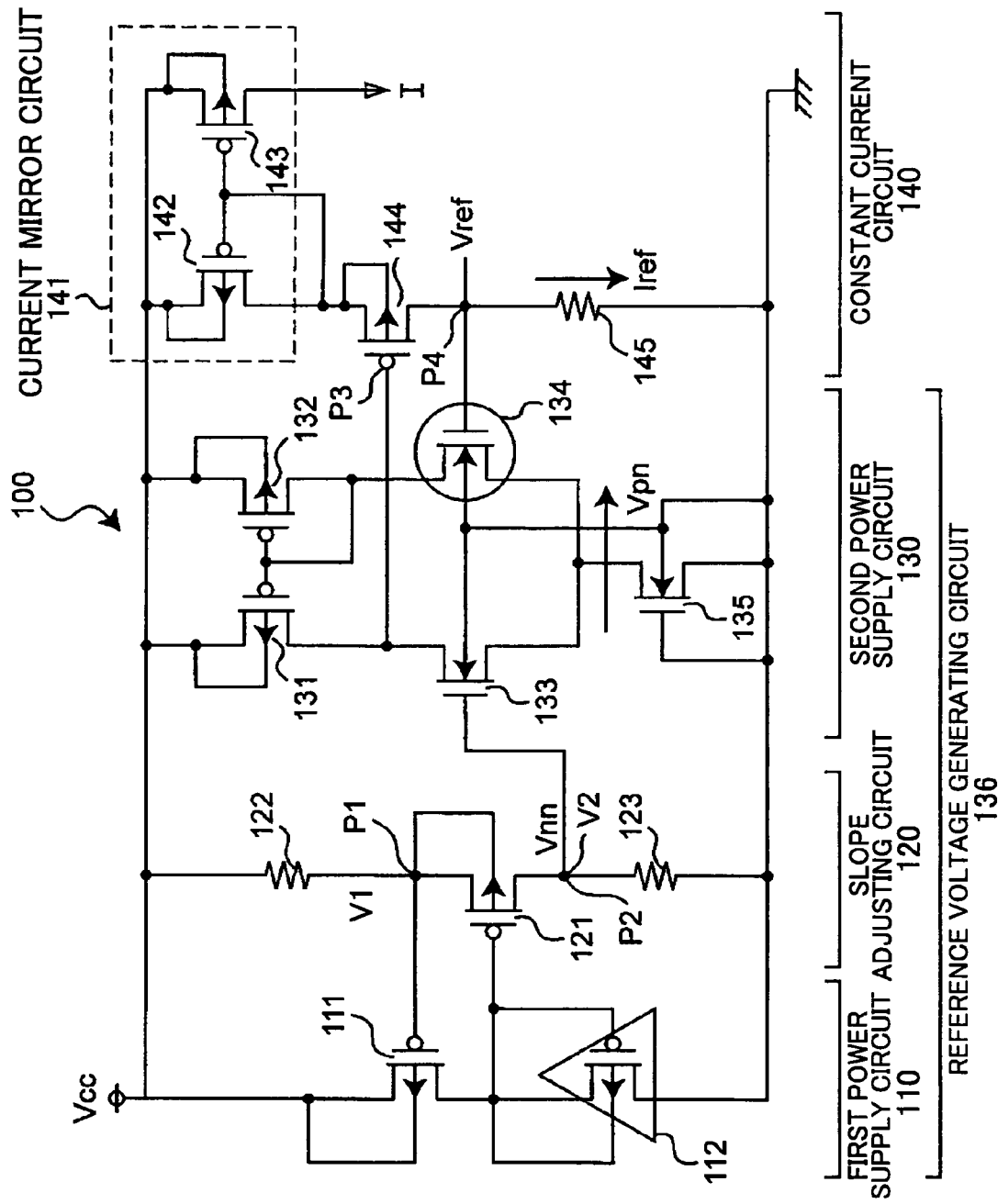
FIG. 1 is a drawing showing the configuration of a constant current generating circuit according to a first embodiment.

FIG. 1 is a drawing showing the configuration of the constant current generating circuit 100 according to the first embodiment. The constant current generating circuit 100 includes a reference voltage generating circuit 136 and a constant current circuit 140 that generates a constant current Iref in response to a reference voltage Vref output from the reference voltage generating circuit 136.

The reference voltage generating circuit 136 includes a first power supply circuit 110, a slope adjusting circuit 120, and a second power supply circuit 130.

Before describing the configuration of each circuit in detail, a brief description will be given of the function of each circuit. The first power supply circuit 110 is comprised of FETs connected in series where these FETs have the same conduction type, and have the gates thereof doped with different impurity densities. The first power supply circuit 110 outputs a first voltage Vnn that has a positive temperature coefficient, so that the output voltage increases in response to an increase in ambient temperature.

The slope adjusting circuit 120 includes two resistors 122 and 123 coupled in series with an FET 121 placed therebetween. The slope adjusting circuit 120 serves to adjust the slope of the temperature coefficient of the first voltage that is output from the first power supply circuit 110.

The second power supply circuit 130 outputs a second voltage Vpn that has a negative temperature coefficient, which is opposite to the operation of the first power supply circuit 110. After the adjustment of the slope of the temperature coefficient of the first voltage, the second power supply circuit 130 serves to add the adjusted first voltage and the second voltage, thereby achieving a zero slope of the temperature coefficient or achieving a slope that can be regarded substantially zero in terms of the precision required by a circuit connected at the subsequent stage. In this manner, the second power supply circuit 130 generates a reference voltage Vref that is stable regardless of changes in ambient temperature.

The constant current circuit 140 includes an output transistor 144, a resistor 145, and a current mirror circuit 141 driven by the reference voltage Vref output from the second power supply circuit 130.

In the following, the configuration of each circuit will be described in greater detail. The constant current generating circuit 100 includes p-channel-type FETs 111, 112, 121, 131, 132, 142, 143, and 144, n-channel-type FETs 133, 134, and 135, and resistors 122, 123, and 145.

The p-channel-type FETs 111 and 112 constituting the first power supply circuit 110 are formed in an n-well of the p-type substrate. The substrate and doped channels have the same impurity density, and the substrate potential is set equal to the source potential. The FET 111 has an n-channel-type gate doped with high density impurity (hereinafter referred to as a high density n-type gate). The FET 112 has an n-channel-type gate doped with low density impurity (hereinafter referred to as a low density n-type gate). The FET 111 and FET 112 have the same ratio S=W/L of a channel width W to a channel length L. The FET 112 functions as a constant current source since its source and gate are connected together. The FET 111 and the FET 112 are connected in series, and have the same current running through. Because of this, the voltage between the source and gate of the FET 111 becomes Vnn (Vcc–V1) where Vcc is the power supply potential, and V1 is a potential at a node P1.

The slope adjusting circuit (also referred to as a source follower circuit) 120 includes two resistors 122 and 123 connected in series to constitute a resistor divider circuit with the FET 121 placed therebetween, which has an n-type gate doped with high density impurity. The gate of the FET 121 is connected to the gate of the FET 112. The node P1, which is the connection point of the source of the FET 121 to the resistor 123, is connected to the gate of the FET 111. A node P2, which is the connection point of the drain of the FET 121 to the resistor 123, is connected to the gate of the FET 133. The slope adjusting circuit 120 applies a voltage to the gate of the FET 111. In this configuration, V2= [(resistance of resistor 123)/(resistance of resistor 122)]× (Vnn) where V2 is the potential at the node P2.

The n-channel-type FET 133 and FET 134 constituting part of the second power supply circuit 130 are formed in the P-type substrate. The substrate and the doped channels have the same impurity density, and the substrate potential is set equal to the GND potential. The FET 133 has a high density n-type gate, and the FET 134 has a high density p-type gate. The FET 133 and FET 134 have the same ratio S=W/L of the channel width W to the channel length L. The second power supply circuit 130 is controlled by the FET 135 serving as a constant current source. The FET 133 and FET 134 are input transistors of a differential amplifier, and have identical currents running therethrough owing to the current mirror circuit comprised of the FET 131 and the FET 132. As a result, the FET 133 and FET 134 of the differential amplifier have a predetermined input offset (Vpn).

The constant current circuit 140 includes the current mirror circuit 141 indicated by the enclosing dashed lines, and further includes the resistor 145 and the FET 144 whose gate opens in response to the output Vref of the second power supply circuit 130. The gate of the FET 144 is connected to an output node P3 of the second power supply circuit 130. A node P4, which is the connection point of the FET 144 to the resistor 145, is connected to the gate of the FET 134. The output node P3 of the second power supply circuit 130, the FET 144, the node P4, and the FET 134 constitute a feedback circuit, according to which the reference voltage Vref at the node P4 is represented as:

$$V2+Vpn=[(\text{resistance of resistor 123})/(\text{resistance of resistor 122})] \times Vnn + Vpn.$$

The resistor 145 has a current Iref running therethrough where Iref=Vref/(resistance of resistor 145). The current Iref is supplied to other circuit elements as a constant current I by use of the current mirror circuit 141.

In the constant current generating circuit 100, the resistors 122, 123, and 145 are made of metal thin films as will be later described in detail, rather than being made of polysilicon as in the well-known configuration. Because of the reasons which will be later described, the constant current generating circuit 100 only relies on the function of the slope adjusting circuit 120 provided in the reference voltage generating circuit 136, and uses the resistor 145 of the constant current circuit 140 having a negative temperature coefficient to cancel the difference between the output of the first power supply circuit 110 having a positive temperature coefficient with respect to ambient temperature changes and the output of the second power supply circuit 130 having a negative temperature coefficient with respect to the ambient temperature changes. Provision is thus made to output the stable constant current I that is not affected by changes in ambient temperature or in the bias voltages applied to the resistors.

If polysilicon is used for the resistor 145 as in the well-known configuration, problems as follows will arise. The first power supply circuit and the second power supply circuit utilizes the principle of a gate work-function differential to generate the voltage Vnn having a positive temperature coefficient and the voltage Vpn having a negative temperature coefficient, respectively. These circuits are thus robust against process variation, and can operate with sufficient precision up to the upper/lower limit temperature of semiconductor operations. Because of this, once the resistor 122 and the resistor 123 are set in the slope adjusting circuit 120, stable Vref can be obtained that has any desired temperature coefficient. With the temperature coefficients of Vref, Vnn, and Vpn being designated as Vref(T), Vnn(T), and Vpn(T), respectively, the following relation is obtained.

$$Vref(T)=[(\text{resistance of resistor 123})/(\text{resistance of resistor 122})] \times Vnn(T) + Vpn(T).$$

According to experiments, Vnn(T) was approximately 200 ppm/° C., and Vpn(T) was approximately −500 ppm/° C. By adjusting a ratio of the resistor 122 to the resistor 123, it was possible to set Vref(T) to any desired value within a range of ±500 ppm/° C.

It is known that if the resistor 145 is made of polysilicon, such a resistor has a negative temperature coefficient with a large absolute value such as −2000 ppm/° C. to −3000 ppm/° C. Accordingly, it is impossible to satisfy the equation for Vref(T) obtained above. If a circuit that generates Vpn in the first power supply circuit 110 and Vnn in the second power supply circuit 130 is taken into consideration (not shown), the value of [(resistance of resistor 123)/(resistance of resistor 122)] needs to be set approximately within a range from 4 to 6. In this case, such a circuit creates a rise in the internal voltage, giving rise to a problem at the time of low voltage operation. Further, the temperature coefficient of a resistor comprised of polysilicon is greatly affected by variation in the sheet resistance of the polysilicon resistor. In order to obtain a stable current Iref, therefore, there is a need to adjust the resistance of the resistor 145 by laser trimming in addition to the adjustment of the value of [(resistance of resistor 123)/(resistance of resistor 122)].

On the other hand, the novel resistor made by employing a metal thin film (a thin film made of silicon chrome SiCr), which will be described in the following, the temperature coefficient can stably be kept to ±100 ppm/° C. more or less. It follows that a mere adjustment of the resistor resistances of the slope adjusting circuit 120 makes it possible to satisfy the above equation for Vref(T). Since the reference voltage generating circuit 136 is designed to operate by utilizing a gate work-function differential, it is robust against process variation, and can generate Vpn and Vnn with sufficient accuracy up to the upper/lower limit temperature of semiconductor operation. Accordingly, the reference voltage Vref, which is made by combining these voltages, can also be generated with sufficient accuracy. The same advantage is also achieved by constant current generating circuits 236, 336, and 436, which are provided in the variations of the constant current generating circuit 100, and will be described later.

The temperature coefficient of the reference voltage Vref can be set to any desired value within a range of approximately ±500 ppm/° C. When metal thin film resistors (silicon chrome in this example) are used as the resistors 122 and 123 of the slope adjusting circuit 120, a depletion layer and accumulation layer are less likely to develop, compared to when the resistors are made of polysilicon. Also, a stable constant current can be generated without being affected by changes in ambient temperature or changes in the potential for driving the circuit.

As described above, the constant current generating circuit 100 can generate a stable constant current Iref by use of metal thin film resistors, which exhibit stable resistances and a stable Vref. For greater stability, further, laser trimming may be utilized.

Figure 2:
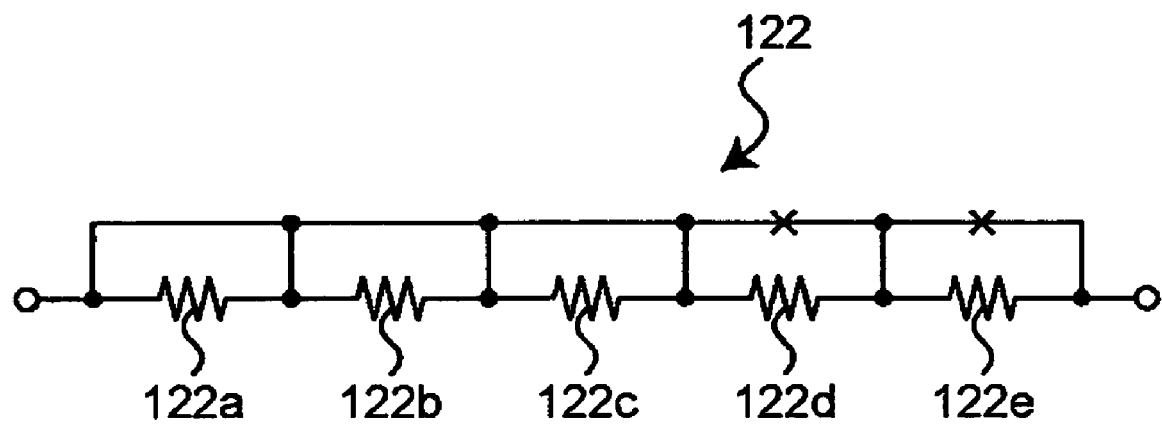
FIG. 2 is a drawing showing a circuit to be subjected to laser trimming provided in a resistor of a slope adjusting circuit.

FIG. 2 is a drawing showing a circuit to be subjected to laser trimming provided in the resistor 122 of the slope adjusting circuit 120. This circuit to be subjected to laser trimming may also be used in the resistor 123 or 145. As illustrated, the circuit to be subjected to layer trimming includes five resistors 122a, 122b, 122c, 122d, and 122e connected in series, each of which has small resistance with the opposite ends thereof short-circuited via a wire. The wire portions indicated by "X" marks may be cut (trimmed) by laser, for example, thereby adjusting the resistance of the resistor 122. It should be noted that the number of the resistors 122a, 122b, . . . , and so on may be modified according to design need.

In the following, a description will be given of the configuration, manufacturing method, and characteristics of the individual resistors 122a, 122b, . . . , and so on constituting the novel resistor 122 made of a metal thin film. Further, a description will be given of variations of the constant current generating circuit 100 (i.e., constant current generating circuits 200, 300, and 400).

(2) Description of Resistors 122, 123, and 145

Each of the resistors 122, 123, and 145 used in the constant current generating circuit 100 includes resistors constituting a resistor divider circuit, each of which has a semiconductor structure that includes a wiring pattern, an insulating film provided on the wiring pattern and having contact holes at the connection points to the wiring pattern, and a metal thin film that has ohmic contacts to the wiring pattern via the contact holes. With this provision, the resistors 122, 123, and 145, which are made of the thin metal films, exhibit more stable resistance against changes in ambient temperature than resistors made of polysilicon. Moreover, the resistance is also stable under the condition of constant ambient temperature. One of the reasons why this is so is believed to be as follows. A difference between a bias voltage applied to a conductive material adjacent to the resistor and a bias voltage applied to the resistor itself may increase. Even when this happens, a resistor made of a metal thin film is less likely to develop a depletion layer or accumulation layer, thereby creating less resistance fluctuation, compared with a resistor made of polysilicon.

The configuration, manufacturing method, and resistor characteristics are the same for all the resistors 122, 123, and 145. In the following, the resistor 122 will be described. FIGS. 3A through 3F and FIGS. 4A through 4E are drawings for explaining steps of manufacturing the resistor 122. FIG. 4E illustrates the configuration of the resistor 122 obtained as a final product of the manufacturing. In FIG. 4E, circuit elements (e.g., transistors and capacitors) that are not relevant to the explanation are omitted from the illustration.

First, a brief description will be given of the configuration of the resistor 122 obtained as a final product with reference to FIG. 4E. Then, the steps of manufacturing the resistor 122 will be described with reference to FIGS. 3A through 3F and FIGS. 4A through 4E. After the description of the steps of manufacturing, a description will be further given of the characteristics of the resistor 122 and other manufacturing methods together with the advantages of such other manufacturing methods.

On part of a silicon substrate 1, a device separating oxide film 2 is formed. On the portion of the silicon substrate 1 that includes the portion where the device separating oxide film 2 is formed, a first inter-layer insulating film (base insulating film) 3 is formed. On the top of the first inter-layer insulating film 3 is formed a wiring pattern 6, which is comprised of a metal material pattern 4 and a refractory metal film 5 formed on the metal material pattern 4. The metal material pattern 4 is made of an AlSiCu film, for example. The refractory metal film 5 is made of a TiN film, for example, and functions as a barrier film also serving as a reflection preventing film.

The wiring pattern 6 has an opening 7 over the device separating oxide film 2. On the wiring pattern 6 and the opening 7 are provided a plasma CVD oxide film 8, an SOG (spin on glass) film 9, and a plasma CVD oxide film 10 in the order named. Hereinafter, these three films are referred to as a second inter-layer insulating film 11. The second inter-layer insulating film 11 has contact holes 12 and 13 at positions where the opposite ends of the metal thin film resistor will be formed, i.e., on the rim of the opening 7.

A thin film resistor (metal thin film resistor) 15 made of silicon chrome is formed on the second inter-layer insulating film 11 between the contact holes 12 and 13 and inside the contact holes 12 and 13 on the inner walls thereof as well as on the wiring pattern 6. The opposite ends of the silicon-chrome thin film resistor 15 have ohmic contacts to the wiring pattern 6 inside the contact holes 12 and 13.

A passivation film 18 is formed on the second inter-layer insulating film 11 and on the silicon-chrome thin film resistor 15. The passivation film 18 includes a silicon oxide film 16 and a silicon nitride film 17 in the named order from bottom to top.

In the following, the steps of manufacturing the resistor 122 will be described one by one with reference to FIGS. 3A through 3F and FIGS. 4A through 4E.

(Step S1)

Figure 3A:
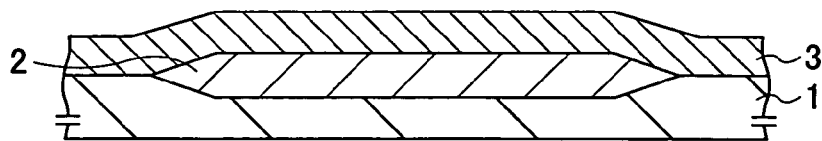
FIGS. 3A through 3F are drawings for explaining steps of manufacturing the resistor.

FIG. 3A is referred to first. A normal pressure CVD apparatus, for example, may be used to form the device separating oxide film 2 and transistor elements and the like (not shown) on the silicon substrate 1 having wafer shape. Thereafter, the first inter-layer insulating film 3 comprised of a BPSG film or PSG film having a thickness of 8000 angstroms is formed on the silicon substrate 1. Heat treatment such as reflow process is then performed to smooth the surface of the first inter-layer insulating film 3.

(Step S2)

Figure 3B:
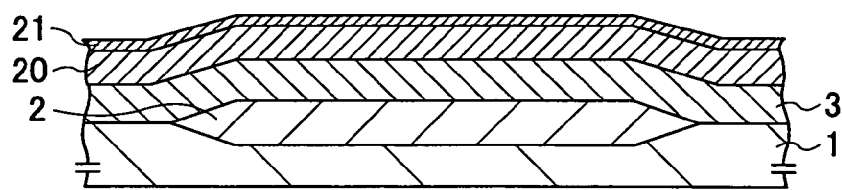

FIG. 3B is referred to. A DC magnetron sputtering apparatus, for example, is used to form an interconnect-purpose metal film 20 made of an AlSiCu film having a thickness of approximately 5000 angstroms on the first inter-layer insulating film 3. Thereafter, a refractory metal film (TiN) 21 is formed to a thickness of approximately 800 angstroms as a reflection preventing film.

Figure 3C:
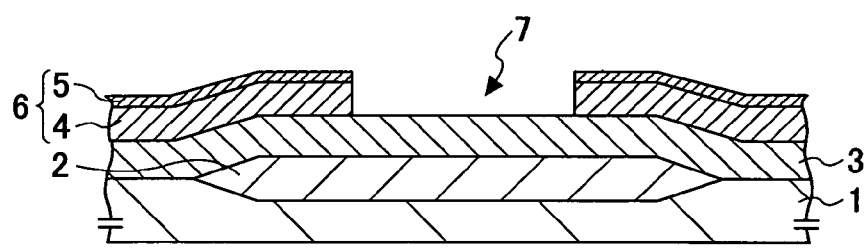

As shown in FIG. 3C, the interconnect-purpose metal film 20 and the refractory metal film 21 are later processed so as to be turned into the metal material pattern 4 and the refractory metal film 5, which together form the wiring pattern 6. The refractory metal film 21 also functions as a barrier film for stabilizing the contact resistance of the contact to the metal thin film resistor. Because of this, it is preferable to form the refractory metal film 21 in the same vacuum immediately after forming the interconnect-purpose metal film 20.

(Step 3)

FIG. 3C is referred to. A conventional photolithography process and etching process are performed to pattern (remove portions of) the refractory metal film 21 and the interconnect-purpose metal film 20, thereby creating the opening 7 and the wiring pattern 6 comprised of the metal material pattern 4 and the refractory metal film 5. After the patterning, the refractory metal film 21 functions as a reflection preventing film. Provision is thus made to minimize the thickening or thinning of a resist pattern that is used to define the areas where the wiring pattern 6 remains.

At this stage, the metal thin film resistor (i.e., the silicon-chrome thin film resistor 15 which will be later described) is not yet formed, so that the base film of the wiring pattern 6 is provided by the first inter-layer insulating film 3. Because of this, the patterning of the refractory metal film 21 and the interconnect-purpose metal film 20 can sufficiently be over-etched by dry etching, which makes it possible to achieve a finer circuit structure, compared with the case in which wet etching is used.

(Step S4)

Figure 3D:
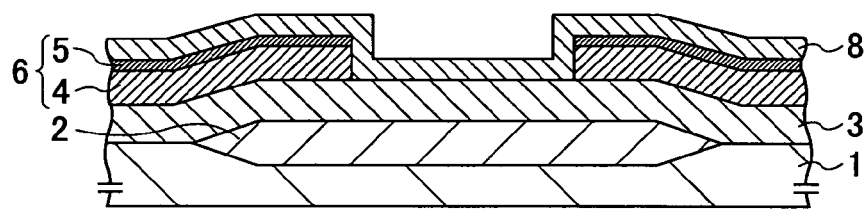

FIG. 3D is referred to. A conventional plasma CVD method, for example, is used to form the plasma CVD oxide film 8 having a thickness of 6000 angstroms on the wiring pattern 6 and the first inter-layer insulating film 3.

(Step S5)

Figure 3E:
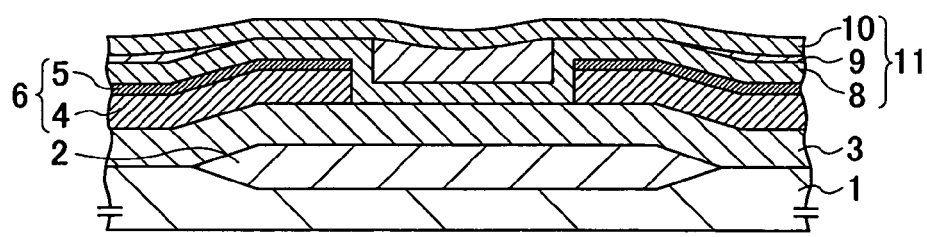

FIG. 3E is referred to. A conventional coating process and etchback process for SOG are performed to generate and smooth the SOG film 9 on the plasma CVD oxide film 8, followed by forming the plasma CVD oxide film 10 having a thickness of approximately 2000 angstroms for preventing diffusion from the SOG film 9. Hereinafter, the plasma CVD oxide film 8, the SOG film 9, and the plasma CVD oxide film 10 are referred to as the second inter-layer insulating film 11.

(Step S6)

Figure 3F:
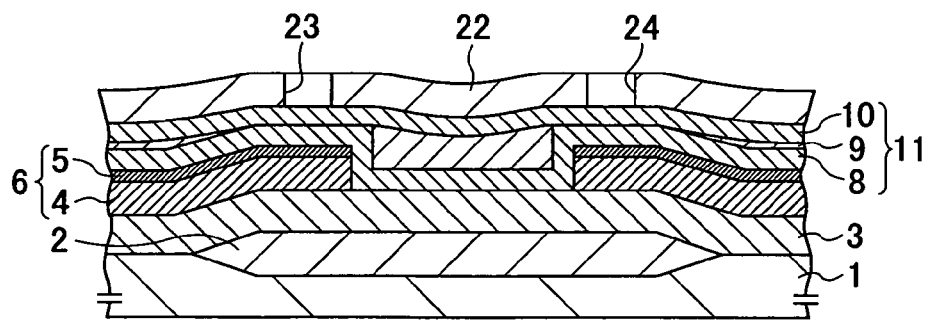

FIG. 3F is referred to. A conventional photolithography process is performed to form a resist pattern 22 on the second inter-layer insulating film 11 at the positions corresponding to the opposite ends of the metal thin film resistor, i.e., on the rim of the opening 7 formed in the wiring pattern 6. Thereafter, two holes 23 and 24 for forming the two contact holes (12 and 13) are formed in the resist pattern 22.

(Step S7)

Figure 4A:
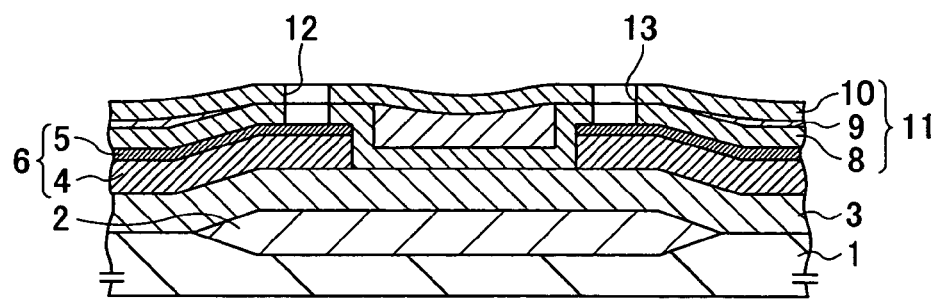
FIGS. 4A through 4E are drawings for explaining steps of manufacturing the resistor.

FIG. 4A is referred to. A conventional parallel-plate plasma etching apparatus, for example, is used to form the contact holes 12 and 13 by using the resist pattern 22 having the holes 23 and 24 as a mask. The etching conditions may be defined as:

RF Power: 700 W;
Ar: 500 sccm (standard cc/minute);
$CHF_3$: 500 sccm;
$CF_4$: 500 sccm; and
Pressure: 3.5 Torr.

The refractory metal film 5 having a thickness of 600 angstroms serving as a reflection prevention film as well as a barrier layer is left remaining at the bottom of the contact holes 12 and 13. After forming the contact holes 12 and 13, the resist pattern 22 is removed.

After the formation of the contact holes 12 and 13, a process of removing byproducts that are generated by the etching process and stuck on the side walls of the contact holes may be performed. Further, a taper etching process or an etching process combining wet etching and dry etching may be employed to improve the shape of the contact holes 12 and 13. This may be done for the purpose of improving the step coverage of the metal thin film resistor inside the contact holes 12 and 13.

In Step S7 described above, the conditions of the plasma etching process may be optimized so as to make the etching rate for the refractory metal film 5 smaller than the etching rate for the second inter-layer insulating film 11. This provides for a sufficiently thick layer of the refractory metal film 5 to be left at the bottom after the formation of the contact holes 12 and 13 while avoiding forming an excessively thick layer of the refractory metal film 5.

Moreover, Step S7 described above is performed prior to the forming of the metal thin film resistor, so that restrictions resulting from the thinness of the metal thin film resistor are not imposed on the process of forming the contact holes 12 and 13. Because of this, the dry etching technology, which is more suited to make fine circuits than the wet etching technology, can be adopted to form the contact holes 12 and 13.

(Step S8)

Figure 4B:
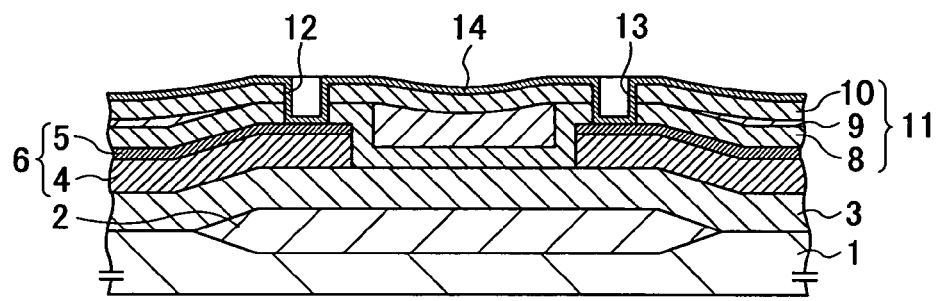

FIG. 4B is referred to. An Ar sputtering chamber of a multi-chamber sputtering apparatus may be used to perform an Ar sputter etching process on the surface of the second inter-layer insulating film 11 inclusive of the interior of the contact holes 12 and 13. The conditions of this process may be defined as:

DC bias: 1250 V;
Ar: 20 sccm;
Pressure: 8.5 mTorr; and
Process Time: 20 seconds.

These conditions of the Ar sputter etching process are the same as the conditions under which a thermal oxide film having approximately a thickness of 50 angstroms is removed in a 1000-° C. wet atmosphere. After this process, the refractory metal film 5 remaining at the bottom of the contact holes 12 and 13 has a thickness of approximately 500 angstroms.

With vacuum being maintained after the completion of the Ar sputter etching process, a silicon chrome thin film (metal thin film) 14 for use as a resistor is formed. Specifically, the silicon wafer is moved from the Ar sputter etching chamber to a sputter chamber for which a silicon chrome target is mounted. Then, a silicon chrome target defined as Si/Cr=80/20 wt % (weight percent) is used under the conditions defined as:

DC Power: 0.7 kW;
Ar: 85 sccm; and
Process Time: 9 seconds.

Such process forms the silicon-chrome thin film 14 having a thickness of approximately 50 angstroms on the surface of the second inter-layer insulating film 11 inclusive of the interior of the contact holes 12 and 13.

As described above, the Ar sputter etching process is performed with respect to the surface of the second inter-layer insulating film 11 inclusive of the interior of the contact holes 12 and 13 prior to the forming of the silicon-chrome thin film 14. Such process not only cleans the interior of the contact holes 12 and 13, but also removes a natural oxide film formed in minute quantity on the surface of the refractory metal film 5 at the bottom of the contact holes 12 and 13. This makes it possible to provide satisfactory ohmic contacts between the wiring pattern 6 and the silicon-chrome thin film 14.

Further, the Ar sputter etching process can improve the dependency of the silicon-chrome thin film resistor (15) on the base film when the silicon-chrome thin film resistor is formed by processing the silicon-chrome thin film 14 at a subsequent stage.

(Step S9)

Figure 4C:
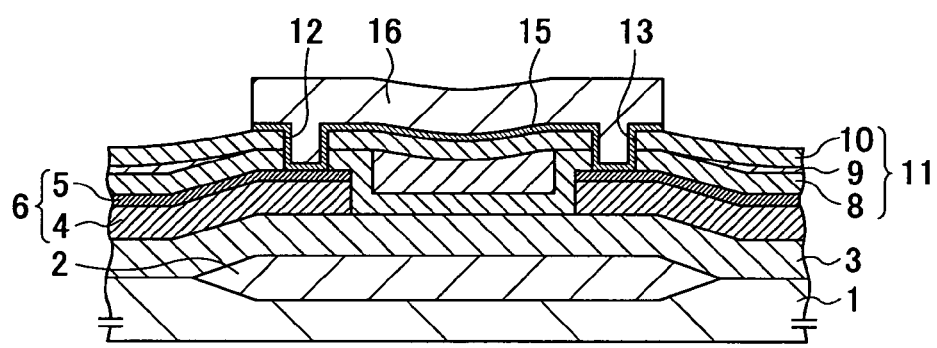

FIG. 4C is refereed to. A conventional photolithography process is performed to form on the silicon-chrome thin film 14 a resist pattern 16 for defining the areas where the silicon-chrome thin film resistor 15 is formed. A RIE (Reactive Ion Etching) apparatus may be used to pattern the silicon-chrome thin film 14 by use of the resist pattern 16 as a mask, thereby forming the silicon-chrome thin film resistor 15.

(Step S10)

Figure 4D:
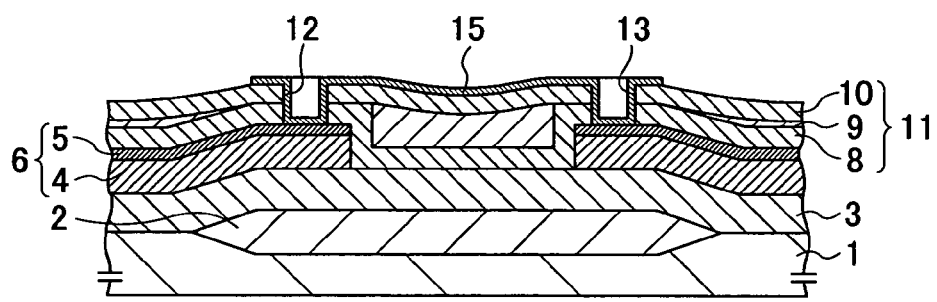
Figure 4E:
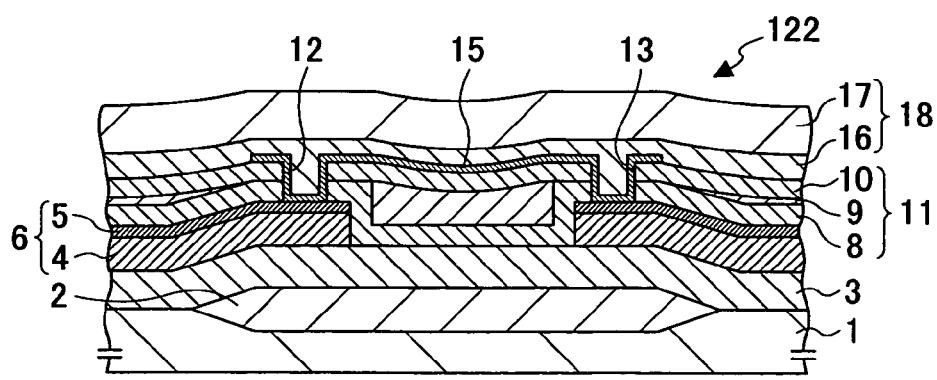

FIG. 4D is referred to. The resist pattern 16 is removed after forming the silicon-chrome thin film resistor 15. The silicon-chrome thin film resistor 15 is electrically connected to the wiring pattern 6 inside the contact holes 12 and 13. Because of this, there is advantageously no need to perform a process of removing a metal oxide film from the surface of the silicon-chrome thin film resistor 15 when providing ohmic contacts on the upper surface of the resistor 122 obtained as part of the final product.

(Step S11)

FIG. 4E is referred to. A plasma CVD method may be used to form the silicon oxide film 16 and the silicon nitride film 17 successively in the order named as the passivation film 18 on the second inter-layer insulating film 11 and on the silicon-chrome thin film resistor 15.

Steps S1 through S11 described above are performed to manufacture the resistor 122.

In the method of manufacturing the resistor 122 described above, the silicon-chrome thin film resistor 15 is formed after the forming of the wiring pattern 6 and the contact holes 12 and 13, and ohmic contacts are established between the silicon-chrome thin film resistor 15 and the wiring pattern 6 inside the contact holes 12 and 13. The use of this manufacturing method is advantageous in that there is no need to perform patterning using a wet etching process after patterning the silicon-chrome thin film resistor 15.

Further, under no circumstances are the contact surfaces of the silicon-chrome thin film resistor 15 and the wiring pattern 6 exposed to atmosphere. Stable ohmic contacts can thus be provided between the silicon-chrome thin film resistor 15 and the wiring pattern 6 without performing a process of removing a surface oxide film and a process of forming a barrier film for preventing erroneous removal by etching with respect to the silicon-chrome thin film resistor 15. This achieves miniaturization of the silicon-chrome thin film resistor 15 and stabilization of its resistance regardless of the thickness of the silicon-chrome thin film resistor 15 without a need for additional manufacturing steps.

Further, the refractory metal film 5 functioning as a barrier film is provided between the silicon-chrome thin film resistor 15 and the metal material pattern 4. With this provision, it is possible to reduce variation in the contact resistance between the silicon-chrome thin film resistor 15 and the wiring pattern 6. The resistance is thus stabilized, and the production yield of the resistor 122 is improved.

Moreover, the refractory metal film 5 functions as a reflection preventing film as well as a barrier film. The number of manufacturing steps and manufacturing costs can be reduced compared with the conventional manufacturing method that forms a separate barrier film. Also, the contact resistance between the wiring pattern 6 and the silicon-chrome thin film resistor 15 serving as a metal thin film resistor can be stabilized.

(3) Characteristics of Resister 122

It is know that the resistance of a resistor made of polysilicon fluctuates due to the creation of a depletion layer or accumulation layer in the resistor in response to a difference between the bias voltage applied to an adjacent conductor and the bias voltage applied to the resistor itself. On the other hand, the resistor 122 manufactured by Steps S1 through S11 described above is less likely to create a depletion layer or accumulation layer under the same conditions, so that its resistance exhibits smaller fluctuation.

Figure 5:
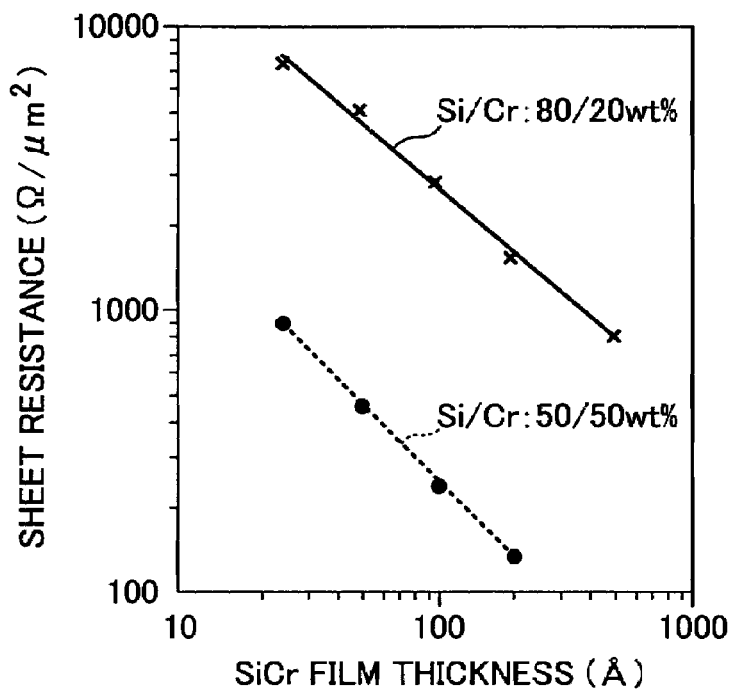
FIG. 5 is a diagram showing the relationship between the sheet resistance ($\Omega/\mu m^2$) of a metal thin film resistor provided in the resistor and the thickness of the film.
Figure 6:
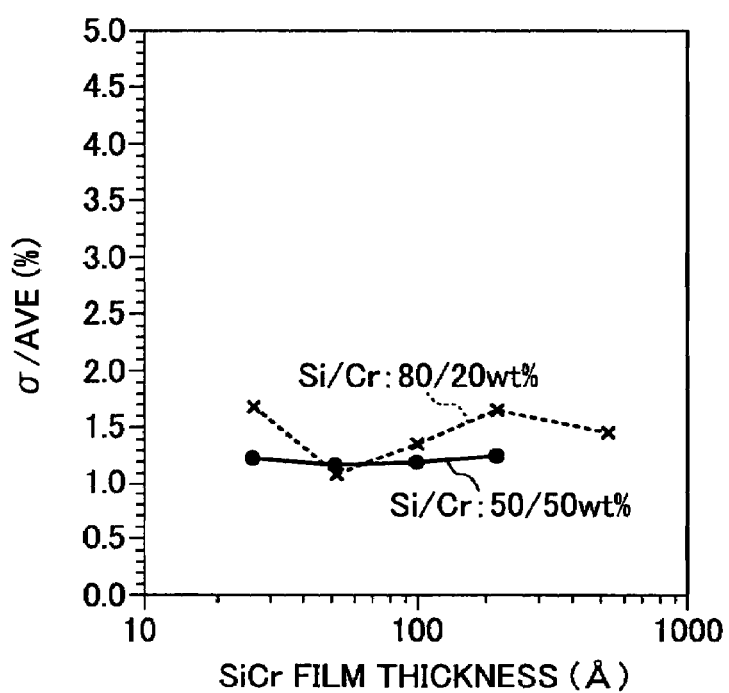
FIG. 6 is a diagram showing the relationship between the thickness of a silicon-chrome film and a value ($\sigma$/AVE) obtained by dividing a standard variation ($\sigma$) by an average (AVE) where the standard variation ($\sigma$) and the average (AVE) are those of measurements of the sheet resistance of the silicon-chrome film.

In the following, a description will be given of the characteristics of the resistor 122 manufactured by Steps S1 through S11 described above with reference to FIG. 5 and FIG. 6. FIG. 5 is a diagram showing the relationship between the sheet resistance ($\Omega/\mu m^2$) of the metal thin film resistor (silicon-chrome thin film resistor) 15 provided in the resistor 122 and the thickness (in angstroms) of the film. FIG. 6 is a diagram showing the relationship between the thickness of the silicon-chrome film and a value ($\sigma$/AVE) obtained by dividing a standard variation ($\sigma$) by an average (AVE) where the standard variation ($\sigma$) and the average (AVE) are those of measurements of the sheet resistance of the silicon-chrome thin film resistor 15 obtained at 63 points on the wafer surface.

In order to create the charts shown in FIG. 5 and FIG. 6, a multi-chamber sputtering apparatus was used to produce samples of the resistor 122 having a varying thickness of 25 to 500 angstroms through the adjustment of growth time. This process was performed under the conditions defined as:
  DC Power: 0.7 kW;
  Ar: 85 sccm; and
  Pressure: 8.5 mTorr, with respect to two types of targets, i.e., Si/Cr=50/50 wt % (first target) and Si/Cr=80/20 wt % (second target). Four samples were produced for the first target, and five samples were produced for the second target. A sample having a film thickness of 500 angstroms was not produced with respect to the first target. In FIG. 5 and FIG. 6, plots for the first target are connected by dotted lines, and plots for the second targets are connected by solid lines.

The Ar sputter etching process, which has been described in connection with Step S8, was performed prior to the forming of the silicon-chrome thin film with respect to each of the samples. The multi-chamber sputtering apparatus was used to perform the process for 160 seconds under the conditions defined as:
  DC bias: 1250 V;
  Ar: 20 sccm; and
  Pressure: 8.5 mTorr.

This Ar sputter etching process is equivalent to a process of removing a thermal-oxide film by approximately a thickness of 400 angstroms through etching in the 1000-° C. wet atmosphere.

In each sample, only an AlSiCu film (metal material pattern 4) having a thickness of 5000 angstroms is used as the wiring pattern 6, which is connected to the silicon-chrome thin film resistor 15 serving as a metal thin film resistor. In this configuration, no TiN film of the refractory metal film 5 is provided at the bottom of the contact holes 12 and 13.

Measurement of the sheet resistance ($\Omega/\mu m^2$) is carried out by employing the two-terminal method, in which a voltage of 1 V is applied to the opposite ends of one of the produced resistors 122 to measure the electric current. Each of these resistors 122 is a band-shape pattern being 0.5 $\mu m$ in width and 50 $\mu m$ in length, and 20 of such patterns are arranged at 0.5-$\mu m$ intervals. The contact holes 12 and 13, which connect between the wiring pattern 6 and the silicon-chrome thin film resistor 15, have a plan dimension of 0.6 $\mu m$ by 0.6 $\mu m$.

As shown in FIG. 5, the first target (Si/Cr=50/50 wt %: shown by dotted lines) and the second target (Si/Cr=80/20 wt %: shown by solid lines) maintain linearity between the film thickness and the sheet resistance from a film thickness of 200 angstroms or more to an extremely thin film thickness of 25 angstroms regardless of difference in the composition. As shown here, the manufacturing method described above can produce a metal thin film resistor with the fine dimension that cannot be achieved by the conventional technology using the wet etching technology.

Further, FIG. 6 shows variation in the sheet resistance at 63 points on the wafer surface. As can be seen in FIG. 6, the first target (Si/Cr=50/50 wt %: shown by solid lines) and the second target (Si/Cr=80/20 wt %: shown by dotted lines) are not significantly affected by the film thickness, and exhibit stable resistance values. Accordingly, it is understood that the manufacturing method described above can produce the metal thin film resistor (silicon-chrome thin film resistor) 15 that is extremely thin and fine.

Figure 7A:
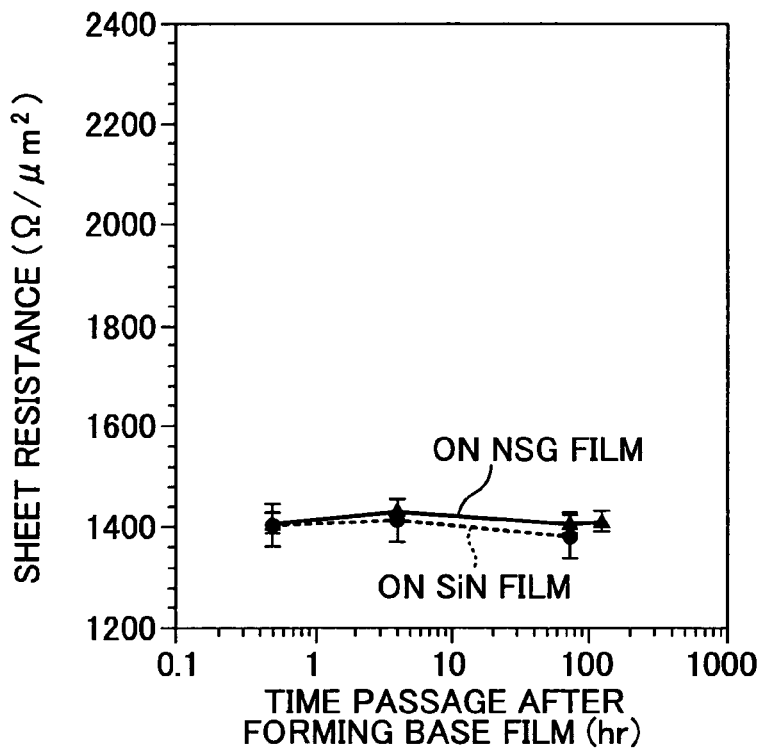
FIG. 7A is a diagram showing the relationship between the sheet resistance ($\Omega/\mu m^2$) of a silicon-chrome thin film resistor and the time that passes after the forming of a base film for the silicon-chrome thin film resistor where an Ar sputter etching process is performed prior to the forming of the silicon-chrome thin film resistor.
Figure 7B:
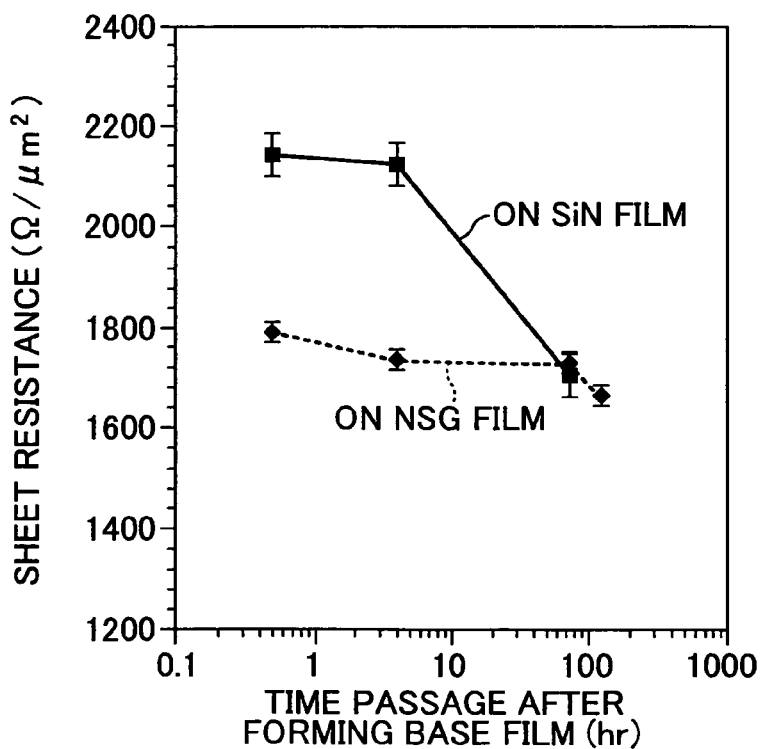
FIG. 7B is a diagram showing the same relationship as that of FIG. 7A where an Ar sputter etching process is performed after the forming of the silicon-chrome thin film resistor.

FIG. 7A is a diagram showing the relationship between the sheet resistance ($\Omega/\mu m^2$) of the silicon-chrome thin film resistor 15 and the time (hour) that passes after the forming of the base film for the silicon-chrome thin film resistor 15 where the Ar sputter etching process is performed prior to the forming of the silicon-chrome thin film resistor 15. FIG. 7B is a diagram showing the same relationship as above where the Ar sputter etching process is performed after the forming of the silicon-chrome thin film resistor 15. In each of these diagrams, the vertical axis represents the sheet resistance ($\Omega/\mu m^2$) of the silicon-chrome thin film resistor 15, and the horizontal axis represents a time (in hours) that passes after the forming of the base film.

For creation of the charts shown in FIG. 7A and FIG. 7B, a plasma CVD method was used to form a plasma SiN film to a film thickness of 2000 angstroms and a plasma NSG (non-doped silicate glass) film. On the two silicon wafers, samples of the resistor 122 were provided by forming the silicon-chrome thin film resistor 15. The sheet resistance ($\Omega/\mu m^2$) of the silicon-chrome thin film resistor 15 provided in the resistor 140 of these two samples was then measured by use of the four-terminal methods.

The plasma SiN film serving as the base film was formed by use of a parallel-plate plasma CVD apparatus under the conditions defined as:
  Temperature: 360° C.;
  Pressure: 5.5 Torr;
  RF Power: 200 W;
  SiH$_4$: 70 sccm;
  N$_2$: 3500 sccm; and
  NH$_3$: 40 sccm.

The plasma NSG film was formed by use of the parallel-plate plasma CVD apparatus under the conditions defined as:
  Temperature: 400° C.;
  Pressure: 3.0 Torr;
  RF Power: 250 W;
  SiH$_4$: 16 sccm; and
  N$_2$O: 1000 sccm.

The silicon-chrome thin film resistor 15 was formed by use of the multi-chamber sputtering apparatus with respect to the target of Si/Cr=80/20 wt % under the conditions defined as:
  DC Power: 0.7 kW;
  Ar: 85 sccm;
  Pressure: 8.5 mTorr; and
  Growth Time: 13 seconds.

A resulting film thickness was 100 angstroms.

On a sample subjected to an Ar sputter etching process, an Ar sputter etching process was performed for a duration of 80 seconds by use of the multi-chamber sputtering apparatus under the conditions defined as:
  DC bias: 1250 V;
  Ar: 20 sccm; and
  Pressure: 8.5 mTorr.

This Ar sputter etching process is equivalent to a process of removing a thermal-oxide film by approximately a thickness of 200 angstroms through etching in the 1000-° C. wet atmosphere.

As shown in FIG. 7B, the sheet resistance varies significantly depending on what the base film is (either the SiN film or the NSG film) when the Ar sputter etching process was not performed prior to the forming of the silicon-chrome thin film resistor 15. Further, it can be seen that an effect of the time length having passed between the forming of the base film and the forming of the silicon-chrome thin film resistor 15 is significant. As shown in FIG. 7A, on the other hand, with the presence of the Ar sputter etching process, the type of the base film and the length of time lapse have little effect on the characteristics of the sheet resistance of the silicon-chrome thin film resistor 15.

As was described toward the end of Step S2, the interconnect-purpose metal film 20 and the refractory metal film 21 are formed in the vacuum that is continuously present following the Ar sputter etching process. This significantly reduces variation in the resistance value caused by the time lapse from the preceding Ar sputter etching process and/or a product-dependent difference in the base film material.

Further, it is found that the Ar sputter etching process is effective not only in reducing influence from the base film but also in improving the stability of the resistance of the silicon-chrome thin film resistor 15.

Figure 8:
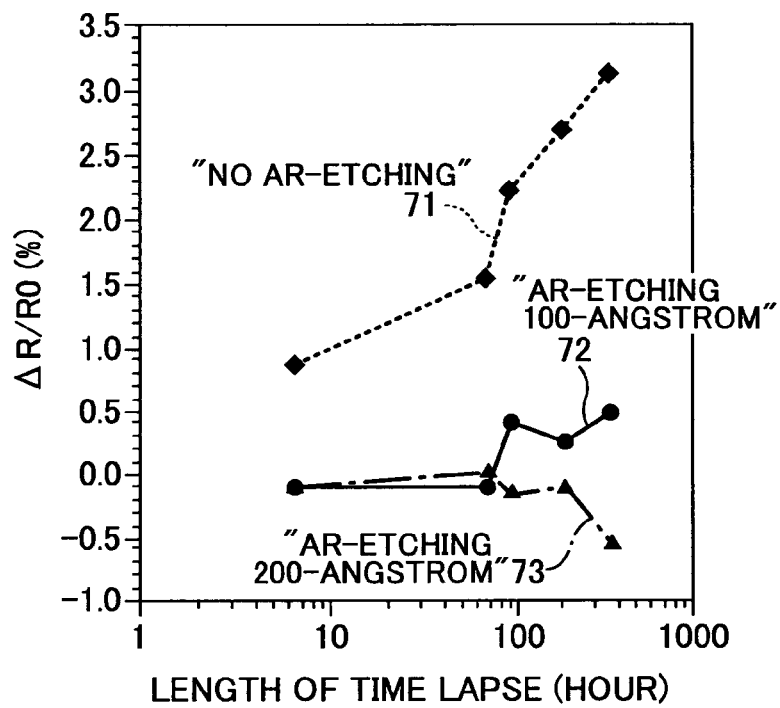
FIG. 8 is a diagram showing the relationship between a time length during which a sample is left in air and a rate of a change from an original sheet resistance.

FIG. 8 is a diagram showing the relationship between the time length during which the sample was left in air at a temperature of 25° C. and at a humidity of 45% after the forming of the silicon-chrome thin film resistor 15 constituting the resistor 122 and a rate of a change ($\Delta R/R0$) from the original sheet resistance R0 observed immediately after the forming thereof. The vertical axis represents $\Delta R/R0$ (%), and the horizontal axis represents a length of time lapse.

The base film and silicon-chrome thin film resistor in the sample of the resistor 122 used for the chart of FIG. 8 were produced under the same conditions as those used for producing the sample of the resistor 122 used for the chart of FIG. 7. The samples of the resistor 122 include a sample for which an Ar sputter etching process was not performed (dotted lines 71 representing the characteristics of this sample), a sample with a thermal-oxide film having a film thickness of 100 angstroms that was formed by an Ar sputter etching process lasting for 40 seconds (solid lines 72 representing the characteristics of this sample), and a sample with a thermal-oxide film having a film thickness of 200 angstroms that was formed by an Ar sputter etching process lasting for 80 seconds (chain lines 73 representing the characteristics of this sample). In the following, the sample for which an Ar sputter etching process was not performed is referred to as a "no Ar-etching" sample. Further, the sample with a film thickness of 100 angstroms for which an Ar sputter etching process was performed for 40 seconds is referred to as an "Ar-etching 100-angstrom" sample, and the sample with a film thickness of 200 angstroms for which an Ar sputter etching process was performed for 80 seconds is referred to as an "Ar-etching 200-angstrom" sample.

With respect to the "no Ar-etching" sample, the resistance increases with the passage of time after the formation. When the sample is left for 300 hours or more, a change in the resistance reaches 3% or more.

With respect to the "Ar-etching 100-angstrom" sample and the "Ar-etching 200-angstrom" sample, a rate of a change in the resistance is significantly smaller. Even after the passage of 300 hours or more, the sheet resistance did not deviate from the ±1% error range.

Further, the "Ar-etching 100-angstrom" sample and the "Ar-etching 200-angstrom" sample are compared. This comparison revels that the amount of Ar sputter etching has little significance, and even a minute amount of etching is effective.

Heretofore, the characteristics of the resistor 122 have been described with respect to the influence of a base film on the sheet resistance and the influence of the time lapse in air on the sheet resistance with reference to FIG. 5 through FIG. 8. These characteristics are not limited to the silicon-chrome thin film resistor having the first target composition (Si/Cr=50/50 wt %) or the second target composition (Si/Cr=80/20 wt %). The same characteristics were observed with respect to all the samples of the silicon-chrome thin film with respect to targets ranging from Si/Cr=50/50 to 90/10 wt % and all the samples of a nitride chrome silicide (CrSiN) thin film. Further, the Ar sputter etching method is not limited to the DC bias sputter etching method used in the examples described above.

Figure 9:
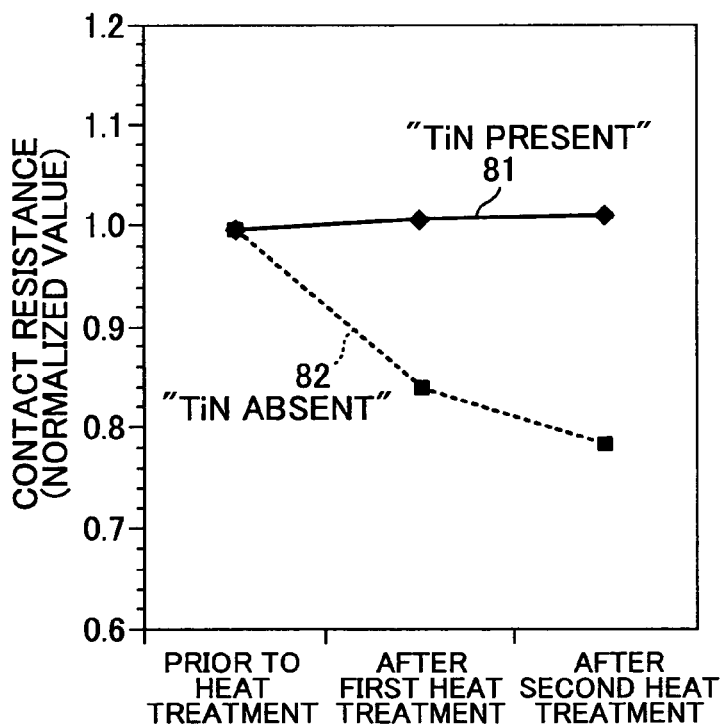
FIG. 9 is a diagram showing variation in the contact resistance between a metal thin film resistor and metal interconnects caused by heat treatment.

FIG. 9 is a diagram showing variation in the contact resistance between the metal thin film resistor and metal interconnects caused by heat treatment with respect to a sample in which the refractory metal film 5 was left at the bottom of the contact holes 12 and 13 and a sample in which the refractory metal film 5 was completely removed. The vertical axis represents the contact resistance that is standardized by the contact resistance observed prior to heat treatment, and the horizontal axis represents the number of heat treatments.

For FIG. 9, an operating time of the dry etching process for forming the contact holes 12 and 13 was adjusted to produce two samples. In one sample of the resistor 122, the refractory metal film having approximately a thickness of 500 angstroms was left at the bottom of the contact holes 12 and 13. In the other sample of the resistor 122, the refractory metal film was completely removed. A TiN film was used as the refractory metal film 5. The silicon-chrome thin film resistor 15 having a thickness of 50 angstroms was formed under the conditions:

Si/Cr=80/20 wt %;
DC Power: 0.7 kW;
Ar: 85 sccm;
Pressure: 8.5 mTorr; and
Growth Time: 6 seconds.

The Ar sputter etching process prior to the forming of the silicon-chrome thin film resistor 15 was performed under the conditions defined as:

DC bias: 1250 V;
Ar: 20 sccm;
Pressure: 8.5 mTorr; and
Process Time: 160 seconds.

This Ar sputter etching process is equivalent to a process of removing a thermal-oxide film by approximately a thickness of 400 angstroms through etching in the 1000-° C. wet atmosphere. The contact holes 12 and 13 had a plan dimension of 0.6 μm by 0.6 μm. The four-terminal method was used to measure the contact resistance.

The samples of the resistor 122 described above were subjected to heat treatment for 30 minutes in nitrogen atmosphere at a temperature of 350° C., and the characteristics of the contact resistance were studied to see what changes were present. The sample of the resistor 122 which had a TiN film serving as the refractory metal film 5 at the bottom of the contact holes 12 and 13 exhibited, after the heat treatment were performed twice under the conditions as described above, almost the same contact-resistance characteristics as before the heat treatment (solid lines indicated as "TiN PRESENT" 81). On the other hand, the sample in which the TiN film was completely removed exhibited, after the heat treatment were performed twice under the conditions as described above, a change of more than 20% in the contact resistance compared to the contact resistance existed prior to the heat treatment (dotted lines indicated as "TiN ABSENT" 82. This indicates that the TiN film used as the refractory metal film 5 functions as a barrier film for preventing resistance variation caused by interactions between the silicon-chrome thin film resistor 15 and the metal material pattern 4 constituting the wiring pattern 6.

The provision of the TiN film serving as the refractory metal film 5 between the silicon-chrome thin film resistor 15 and the metal material pattern 4 can significantly reduce a variation in the contact resistance that may be caused by heat treatment such as sintering and/or CVD during the manufacturing process. Further, the provision makes it possible to prevent variation in the contact resistance caused by heat treatment such as soldering performed during the subsequent assembling process. Because of this, the contact resistance as specified by the design is stably obtained, and a variation in the contact resistance is prevented before and after the assembling process. The product can thus be obtained with increased precision at an increased production yield.

In the method of manufacturing the resistor 122 described with reference to FIGS. 3A–3F and FIGS. 4A–4E, the interconnect-purpose metal film 20 and the refractory metal film 21 are formed continuously in vacuum at Step S2. The present invention is not limited to such a method.

For example, the interconnect-purpose metal film 20 may be formed and exposed to air, and, then, the refractory metal film 21 may be formed. In such a case, a natural oxide film created on the surface of the interconnect-purpose metal film 20 has such an effect that it is difficult to secure an electrical connection between the interconnect-purpose metal film 20 and the refractory metal film 21. As described above, the wiring pattern 6 is comprised of the metal material pattern 4 and the refractory metal film 5, which are formed by patterning the interconnect-purpose metal film 20 and the refractory metal film 21, respectively. At the step of forming the contact holes 12 and 13 in the second inter-layer insulating film 11 disposed on the wiring pattern 6, the refractory metal film 5 may be completely removed at the bottom of the contact holes 12 and 13, thereby providing for satisfactory ohmic contacts to be established between the wiring pattern 6 and the silicon-chrome thin film resistor 15.

In Step S2 described above, the refractory metal film 21 serving as a reflection preventing film and a barrier film has a film thickness of 800 angstroms. An embodiment of the present invention is not limited to this example. In general, a refractory metal film serving as a reflection preventing film is formed to a thickness of 500 angstroms or less. In the method of manufacturing the resistor 122 described with reference to FIGS. 3A–3F and FIGS. 4A–4E, the thickness of the refractory metal film 5 is slightly reduced by over-etching performed at the time of forming the contact holes 12 and 13 (see Step S7) or by an Ar sputter etching process performed at the time of forming the silicon-chrome thin film (See Step S8). If it is desired to leave the refractory metal film 5 serving as a barrier film stably functioning at the bottom of the contact holes 12 and 13, the thickness of the refractory metal film 21 may be preferably set to 500 angstroms or more.

As described above, however, the conditions of the etching process for forming the contact holes 12 and 13 and the conditions of the Ar sputter etching process may be optimized. With such optimization, a reduction in the thickness of the refractory metal film 5 may be kept to a minimum, so that it properly functions as a barrier film even if the thickness of the refractory metal film 5 is less than 500 angstroms.

In Step S8 described above, the Ar sputter etching process is performed immediately before the forming of the silicon-chrome thin film 14. If the refractory metal film 5 that is a TiN film serving as a barrier film is left remaining at the bottom of the contact holes 12 and 13, the refractory metal film 5, upon being exposed to air, does not develop a natural oxide film as sturdy as in the case of an AlSiCu film. Because of this, satisfactory ohmic contacts can be established between the silicon-chrome thin film 14 and the wiring pattern 6 without performing an Ar sputter etching process immediately before the forming of the silicon-chrome thin film 14. As was described in connection with FIG. 8, however, an Ar sputter etching process performed immediately prior to the forming of the silicon-chrome thin film 14 provides for the resistance of the silicon-chrome thin film resistor 15 to be more stabilized. It is thus preferable to carry out such an Ar sputter etching process.

In the resistor 122, the SOG film 9 is formed and smoothed by the etchback technology to generate the second inter-layer insulating film 11. An insulating film (or insulating layer) serving as a base for the silicon-chrome thin film 14 is not limited to such an example. An insulating film serving as a base for the silicon-chrome thin film 14 may be smoothed by the well-known CMP (chemical mechanical polish) technology. Alternatively, other insulating films may be used such as a plasma CVD oxide film that is not subjected to smoothing.

It should be noted that some analog resistors are often used in the configuration in which not only TCR but also a pairing characteristic and ratio precision are important factors. If the metal thin film resistor (silicon-chrome thin film resistor 15) forming the resistor 122 is used as an analog resistor, it is preferable to perform smoothing with respect to the second inter-layer insulating film 11 serving as a base for the metal thin film resistor.

With respect to the resistor 122, the passivation film 18 is formed on the silicon-chrome thin film resistor 15. This is not a limiting example. The film deposited on the silicon-chrome thin film resistor 15 may be an insulating film different from the passivation film 18 such as an inter-later insulating film for forming second-layer metal interconnects, for example.

(4) Description of Variation of Resistor Manufacturing Method

Figure 10A:
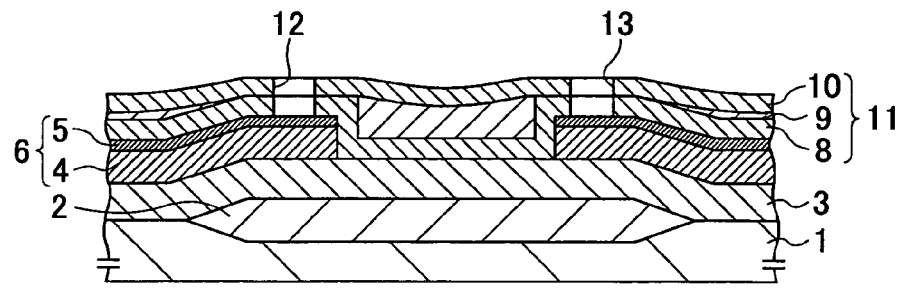
FIGS. 10A through 10D are drawings for explaining a method of manufacturing a variation of the resistor.
Figure 10B:
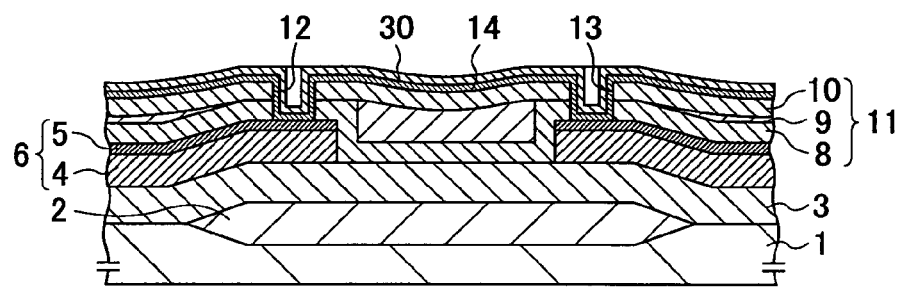
Figure 10C:
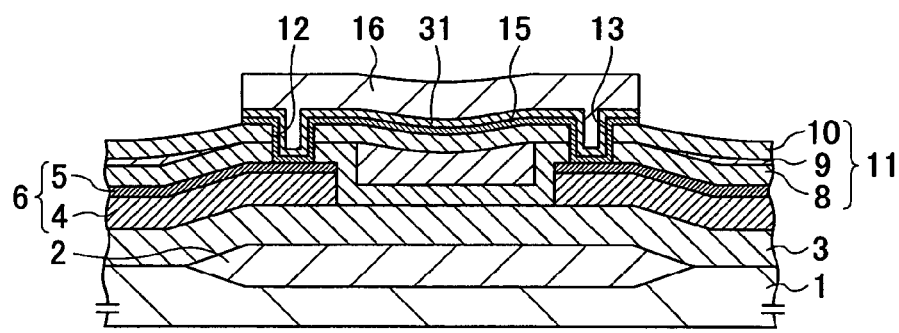
Figure 10D:
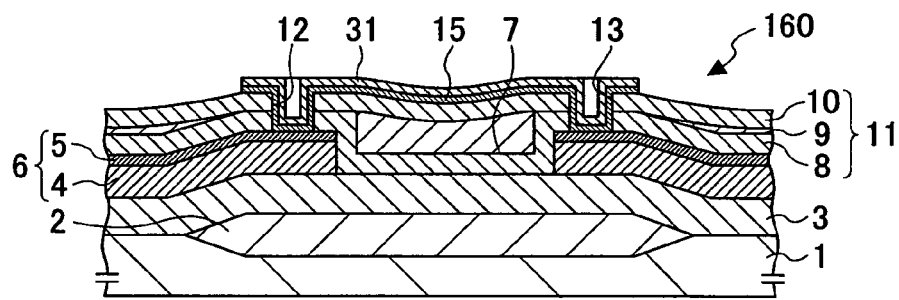

FIGS. 10A through 10D are drawings for explaining a method of manufacturing a resistor 160 that is a variation of the resistor 122 described above. The resistor 160 can be used as a substitute for the resistor 122 in the circuit shown in FIG. 1. FIG. 10D illustrates the final construction of the resistor 160. In actuality, transistor elements, capacitor elements, and the like are formed on the same substrate that is used for the resistor 160. These elements are omitted from the illustration. The same elements as those used in the method of manufacturing the resistor 122 shown in FIGS. 3A–3F and FIGS. 4A–4E are referred to by the same numerals, and a duplicate description thereof will be omitted.

The construction of the resistor 160 will be described first with reference to FIG. 10D. On the silicon substrate 1, the device separating oxide film 2, wiring pattern 6, and the second inter-layer insulating film 11 are formed from bottom to top in the order named. The wiring pattern 6 is made by disposing the first inter-layer insulating film 3, the metal material pattern 4, and the refractory metal film 5 from bottom to top in the order named. The second inter-layer insulating film 11 is made by disposing the plasma CVD oxide film 8, the SOG film 9, and the plasma CVD oxide film 10 from bottom to top in the order named. The second inter-layer insulating film 11 has the two contact holes 12 and 13 at positions corresponding the opposite ends of the metal thin film resistor, i.e., on the rim of the opening 7 (see FIG. 3C) formed in the wiring pattern 6.

The silicon-chrome thin film resistor 15 is formed on the second inter-layer insulating film 11 between the contact holes 12 and 13 and inside the contact holes 12 and 13 on the inner walls thereof as well as on the wiring pattern 6. A nitride-chrome-silicide thin film (metal nitride film) 31 is formed on the silicon-chrome thin film resistor 15. No chrome-silicon-oxide (CrSiO) film is provided between the silicon-chrome thin film resistor 15 and the nitride-chrome-silicide thin film 31. Further, an inter-layer insulating film (not shown) or passivation film (corresponding to the passivation film 18 of the resistor 122 shown in FIG. 4E) is formed on the second inter-layer insulating film 11 inclusive of the area where the silicon-chrome thin film resistor 15 is formed.

In the following, a method of manufacturing the resistor 160 will be described with reference to FIGS. 10A through 10D.

(Step S20)

FIG. 10A is referred to. The same manufacturing steps as Step S1 through Step S7 described in connection with FIGS. 3A–3F and FIG. 4A have been already performed, so that the first inter-layer insulating film 3, the wiring pattern 6 comprised of the metal material pattern 4 and the refractory metal film 5, and the second inter-layer insulating film 11 comprised of the plasma CVD oxide film 8, the SOG film 9, and the plasma CVD oxide film 10 are formed on the silicon substrate 1 having wafer shape on which the first inter-layer insulating film 3 is formed in advance, followed by forming the contact holes 12 and 13 in the second inter-layer insulating film 11.

(Step S21)

FIG. 10B is referred to. The same manufacturing step as that described in connection with Step S8 and FIG. 4B is performed. For example, an Ar sputtering chamber of a multi-chamber sputtering apparatus may be used to perform an Ar sputter etching process in vacuum on the surface of the second inter-layer insulating film 11 inclusive of the interior of the contact holes 12 and 13. With the vacuum being maintained after the completion of the Ar sputter etching process, the silicon-chrome thin film 14 for use as a metal thin film resistor is formed.

Continuously without disrupting the vacuum following the forming of the silicon-chrome thin film 14, a nitride-chrome-silicide thin film 30 is formed on the silicon-chrome thin film 14. Here, the silicon chrome target defined as Si/Cr=80/20 wt % used for the forming of the silicon-chrome thin film 14 is used under the conditions defined as:

DC Power: 0.7 kW;
Ar+$N_2$: 85 sccm;
Pressure: 8.5 mToor; and
Process Time: 6 seconds.

Such process forms the nitride-chrome-silicide thin film 30 having a thickness of approximately 50 angstroms on the surface of the silicon-chrome thin film 14.

(Step S21)

FIG. 10C is referred to. The same manufacturing step as that described in connection with Step S9 and FIG. 4C is performed. A conventional photolithography process is performed to form on the nitride-chrome-silicide thin film 30 a resist pattern 16 for defining the areas where the metal thin film resistor is formed. A RIE (Reactive Ion Etching) apparatus may be used to pattern the nitride-chrome-silicide thin film 30 and the silicon-chrome thin film 14 by use of the resist pattern 16 as a mask, thereby forming a multilayer pattern comprised of the nitride-chrome-silicide thin film 31 and the silicon-chrome thin film resistor 15.

(Step S22)

FIG. 10D is referred to. The resist pattern 16 is removed after the forming of the multiplayer pattern comprised of the nitride-chrome-silicide thin film 31 and the silicon-chrome thin film resistor 15. In the same manner as in the previous embodiment, the silicon-chrome thin film resistor 15 is electrically connected to the wiring pattern 6, so that there is no need to perform a process of removing a metal oxide film from the surface of the silicon-chrome thin film resistor 15 by use of a hydrofluoric acid solution. Further, the upper surface of the silicon-chrome thin film resistor 15 is covered by the nitride-chrome-silicide thin film 31. Because of this, there is an advantage in that exposure to atmosphere containing oxygen such as air does not cause oxidization of the upper surface of the silicon-chrome thin film resistor 15.

Although not illustrated, an inter-layer insulating film or passivation film (see the passivation film 18 shown in FIG. 4E) is formed on the second inter-layer insulating film 11 inclusive of the area where the silicon-chrome thin film resistor 15 and the nitride-chrome-silicide thin film 31 are formed.

In general, a metal thin film made of such material as silicon chrome is highly reactive with oxygen, so that exposure of the metal thin film to air for a long duration results in a resistance change. In the case of the resistor 160, the nitride-chrome-silicide thin film 31 is provided on the upper surface of the silicon-chrome thin film resistor 15. This prevents the resistance of the silicon-chrome thin film resistor 15 from changing with time due to the exposure to air of the upper surface of the silicon-chrome thin film resistor 15. It should be noted that ohmic contacts are already in existence between the silicon-chrome thin film 14 and the wiring pattern 6 at the stage where the silicon-chrome thin film 14 for forming the silicon-chrome thin film resistor 15 is deposited. Because of this, deposition of an additional film on the silicon-chrome thin film 14 does not affect the characteristics.

Figure 11:
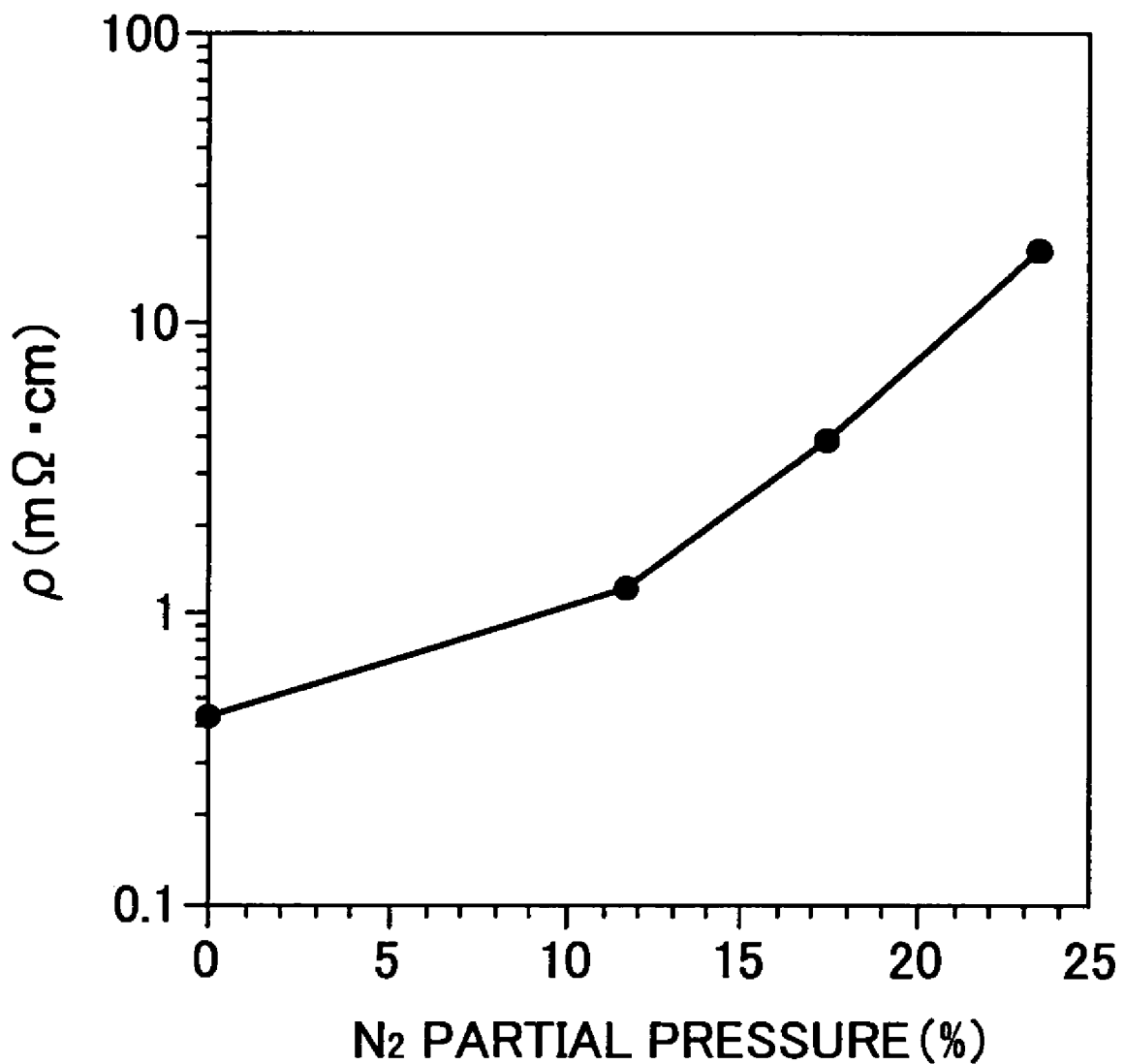
FIG. 11 is a diagram showing the relationship between the partial pressure of $N_2$ of a gas used for forming a nitride-chrome-silicide thin film and the resistivity of the nitride-chrome-silicide thin film.

FIG. 11 is a diagram showing the relationship between the partial pressure of $N_2$ of a gas used for forming the nitride-chrome-silicide thin film and the resistivity of the nitride-chrome-silicide thin film. The vertical axis represents the resistivity $\rho$ (m$\Omega$●cm: milliohm●centimeter), and the horizontal axis represents $N_2$ partial pressure (%). In this example, the nitride-chrome-silicide thin film was formed while adjusting the $N_2$ partial pressure of an Ar+$N_2$ gas under the conditions defined as:

Target: Si/Cr=50/50 wt %
DC Power: 0.7 kW;
Ar+$N_2$: 85 sccm;
Pressure: 8.5 mToor; and
Process Time: 6 seconds.

The nitride-chrome-silicide thin film formed by reactive sputter with an $N_2$ partial pressure of 18% or more exhibits more than 10 times as large resistivity as in the case where a gas with no addition of $N_2$ is used (i.e., an $N_2$ partial pressure of 0%). Accordingly, the deposition of a nitride-chrome-silicide thin film by using an $N_2$ partial pressure of 18% or more ensures that the resistance of the entirety of the silicon-chrome thin film is controlled by the silicon-chrome thin film even in the presence of the nitride-chrome-silicide thin film deposited directly on the silicon-chrome thin film resistor. That is, the nitride-chrome-silicide thin film hardly affects the resistance. Here, the upper limit of the $N_2$ partial pressure is approximately 90%. If the $N_2$ partial pressure is set higher than 90%, the speed of sputtering lowers significantly, resulting in an undesirable drop in the production efficiency.

In the case of the resistor 160, the nitride-chrome-silicide thin film 31 is formed on the silicon-chrome thin film resistor 15. Alternatively, an insulating film of a CVD system such as a silicon nitride film may be formed on the silicon-chrome thin film resistor 15. A multi-chamber sputter apparatus having a general configuration, however, does not have a CVD chamber connected thereto. In order to form an insulating film of a CVD system on the silicon-chrome thin film resistor 15 continuously in the vacuum, thus, there is a need to install a new facility, which greatly affects the production costs.

In the case of the resistor 160, the nitride-chrome-silicide thin film 30 is formed on the silicon-chrome thin film 14 for forming the silicon-chrome thin film resistor 15. For this provision, there is no need to purchase a new apparatus. An existing multi-chamber sputter apparatus can be used to form the nitride-chrome-silicide thin film 30 to serve as an anti-oxygen cover film for the silicon-chrome thin film resistor 15 while continuously maintaining the vacuum state.

In the example described above with respect to the resistor 160, a TiN film is used as the refractory metal film 5. The refractory metal film constituting the wiring pattern 6 is not limited to this composition, and other refractory metal thin film such as TiW or WSi may be used.

In the example of the resistor 160, only one layer of the wiring pattern 6 is provided as metal interconnects. This is not a limiting example. A resistor may have a multilayer metal interconnect structure in which multiple wiring patterns are provided.

In the example of the resistor 160, the wiring pattern 6 is comprised of the metal material pattern 4 and the refractory metal film 5 formed on the upper surface of the metal material pattern 4. This is not a limiting example. As a wiring pattern, only the metal material pattern 4 may be used without forming the refractory metal film 5 on the upper surface thereof. In this case, an Al alloy may be used as the metal material pattern 4. In such a case, however, a robust natural oxide film is formed on the surface of the metal material pattern. It is thus preferable to perform a process of removing a natural oxide film from the surface of the metal material pattern at the bottom of the contact holes prior to the depositing of a metal thin film for forming a metal thin film resistor and after the forming of the contact holes. This process of removing a natural oxide film may be performed together with an Ar sputter etching process for the purpose of suppressing a change with time of the resistance of the silicon-chrome thin film resistor 15.

In the example of the resistor 160, further, the wiring pattern 6 for controlling the potential of the silicon-chrome thin film resistor 15 is comprised of the metal material pattern 4 and the refractory metal film 5. Alternatively, a polysilicon pattern may be used in place of the metal material pattern 4.

(5) Description of Another Variation of Resistor Manufacturing Method

Figure 12A:
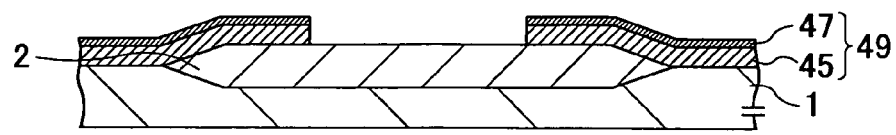
FIGS. 12A through 12D are drawings for explaining a method of manufacturing another variation of the resistor.
Figure 12B:
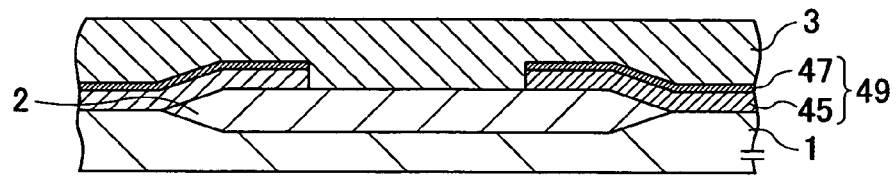
Figure 12C:
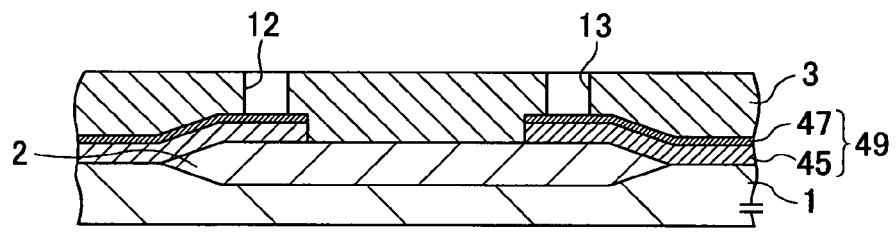
Figure 12D:
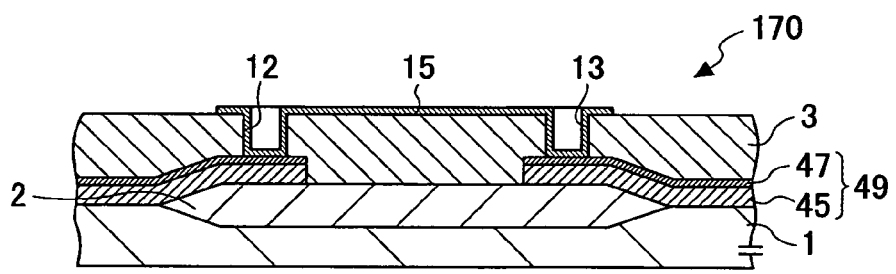

FIGS. 12A through 12D are drawings for explaining a method of manufacturing a resistor 170 that is another variation of the resistor 122. The resistor 170 can be used as a substitute for the resistor 122 in the circuit shown in FIG. 1. FIG. 12D illustrates the final construction of the resistor 170. In actuality, transistor elements, capacitor elements, and the like are formed on the same substrate that is used for the resistor 170. These elements are omitted from the illustration. The same elements as those used in the method of manufacturing the resistor 122 shown in FIGS. 3A–3F and FIGS. 4A–4E are referred to by the same numerals, and a duplicate description thereof will be omitted.

An embodiment of the resistor 170 will be described first with reference to FIG. 12D. The device separating oxide film 2 is formed on the silicon substrate 1. A wiring pattern 49 is formed on an oxide film (not shown) and the device separating oxide film 2 deposited on the silicon substrate 1. The wiring pattern 49 includes a polysilicon pattern 45 and a refractory metal film 47 formed from bottom to top in the order named. The refractory metal film 47 is made of WS1 or TiSi, for example.

The first inter-layer insulating film 3 is provided on the silicon substrate 1 inclusive of the areas where the wiring pattern 49 and the device separating oxide film 2 are situated. The first inter-layer insulating film 3 has the contact holes 12 and 13 at positions corresponding to the opposite ends of a metal thin film resistor and the wiring pattern 49.

A silicon-chrome thin film resistor 15 is formed on the first inter-layer insulating film 3 between the contact holes 12 and 13 and inside the contact holes 12 and 13 on the inner walls thereof and on the wiring pattern 49. Although not shown, an inter-layer insulating film, a metal interconnect, and a passivation film are formed on the first inter-layer insulating film 3 inclusive of the area where the silicon-chrome thin film resistor 15 is formed.

In the following, a method of manufacturing the resistor 170 will be described with reference to FIGS. 12A through 12D.

(Step S30)

FIG. 12A is referred to. The device separating oxide film 2 is formed on the silicon substrate 1. An oxide film (not shown) such as a transistor gate oxide film is then formed on the silicon substrate 1 other than the area where the device separating oxide film 2 is situated. After this, a polysilicon film (polysilicon pattern) is formed over the entire surface of the silicon substrate 1. Simultaneously with the forming of a transistor gate electrode, for example, a polysilicon pattern 45 having low resistance is formed. A refractory metal film is then formed over the entire surface of the silicon substrate 1 inclusive of the polysilicon pattern 45, thereby turning the polysilicon pattern 45 into salicide. The refractory metal film 47 made of TiSi or WSi, for example, is formed on the polysilicon pattern 45, thereby forming the wiring pattern 49.

(Step S31)

FIG. 12B is referred to. The first inter-layer insulating film 3 is formed over the entire surface of the silicon substrate 1 inclusive of the wiring pattern 49 in the same manner as in Step S1 described in connection with FIG. 3A.

(Step S32)

FIG. 12C is referred to. The photolithography technology is employed to form a resist pattern (not shown) for forming contact holes in the first inter-layer insulating film 3 at positions corresponding to the opposite ends of a metal thin film resistor and the wiring pattern 49. The first inter-layer insulating film 3 is selectively removed by using the resist pattern as a mask, thereby forming the contact holes 12 and 13 in the first inter-layer insulating film 3. The refractory metal film 47 is left remaining at the bottom of the contact holes 12 and 13. Thereafter, the resist pattern is removed.

(Step S33)

FIG. 12D is referred to. The same manufacturing processes as Step S8 and Step S9 described in connection with FIGS. 4B and 4C are performed. For example, a multi-chamber sputtering apparatus may be used to perform an Ar sputter etching process in vacuum on the surface of the second inter-layer insulating film 11 inclusive of the interior of the contact holes 12 and 13. Continuously without disrupting the vacuum following the completion of the Ar sputter etching process, a metal thin film for forming a metal thin film resistor is formed and patterned, thereby providing the silicon-chrome thin film resistor 15.

Although not shown, an inter-layer insulating film, a metal interconnect, and a passivation film are then formed on the first inter-layer insulating film 3 inclusive of the area where the silicon-chrome thin film resistor 15 is formed.

In this embodiment, as in the case of the resistor 122 described with reference to FIGS. 3A–3F and FIGS. 4A–4E, there is no need to perform wet-etching-based patterning after patterning the silicon-chrome thin film resistor 15. Further, the contact surfaces between the silicon-chrome thin film resistor 15 and the wiring pattern 49 are not exposed to air, so that satisfactory ohmic contacts are stably established between the silicon-chrome thin film resistor 15 and the wiring pattern 49. This achieves miniaturization of the silicon-chrome thin film resistor 15 and stabilization of its resistance regardless of the thickness of the silicon-chrome thin film resistor 15 without a need for additional manufacturing steps.

Further, the refractory metal film 47 functioning as a barrier film is provided between the silicon-chrome thin film resistor 15 and the polysilicon pattern 45. With this provision, it is possible to reduce variation in the contact resistance between the silicon-chrome thin film resistor 15 and the wiring pattern 49. The precision of the resistance and a production yield are thus improved.

Moreover, the refractory metal film 47 contributes to the lowering of the resistance of the polysilicon pattern 45. Compared to the conventional technologies, the refractory metal film 47 is formed without having additional manufacturing steps. This makes it possible to stabilize the contact resistance between the metal thin film resistor and the wiring pattern while avoiding an increase in production costs.

In the embodiment of the manufacturing method described above, an Ar sputter etching process is performed prior to the forming of a metal thin film for forming the silicon-chrome thin film resistor 15. Provision is thus made to reduce a variation in the resistance caused by a time lapse from the preceding production step and by a product-dependent difference in the base film material.

In the resistor 170 shown in FIGS. 12A–12D, a nitride-chrome-silicide thin film may be formed on the silicon-chrome thin film resistor 15 as in the resistor 160 shown in FIGS. 10A–10D.

In the resistor 122, 123, 145, 160 (variation of the resistor 122), 170 (variation of the resistor 122), 322 (see the circuit shown in FIG. 15), 323 (see the circuit shown in FIG. 15), or the samples produced under the conditions shown in FIG. 5, FIG. 6, FIG. 7A, FIG. 7B, FIG. 8, FIG. 9, or FIG. 11, a silicon chrome is used as an example of the material used for a metal thin film resistor. The present invention is not limited to this example. As a material for the metal thin film resistor, other material may be used such as nickel chrome (NiCr), nitride tantalum (TaN), chrome silicide ($CrSi_2$), nitride chrome silicide (CrSiN), chrome silicon (CrSi), chrome silicon oxide (CrSiO), etc.

The constant current generating circuit 100 described heretofore has at least two advantages as follows.

[1] When the temperature coefficient of the reference voltage Vref (no need for trimming) is set to zero or substantially zero, the temperature coefficient of a metal thin film made of silicon chrome will appear as the temperature coefficient of the reference current Iref. Since this temperature coefficient of the reference current Iref is nothing but the temperature coefficient of silicon chrome, this coefficient is small and stable. Further, since the slope of the temperature coefficient of the reference voltage Vref is corrected to zero or substantially zero, it can be used as a reference voltage having a zero or substantially zero slope of the temperature coefficient. Accordingly, it is possible to obtain the reference current Iref having a temperature coefficient in the range of ±100 ppm/° C. and the reference voltage Vref having a zero or substantially zero temperature coefficient.

[2] The provision of a resistor whose resistance is adjustable by use of the circuit subjected to laser trimming as shown in FIG. 2 makes it possible to generate a reference current Iref with high precision. Since the temperature coefficient of silicon chrome is approximately ±100 ppm/° C., the temperature coefficient of the reference voltage Vref is also set to approximately ±100 ppm/° C. through laser trimming. It is thus possible to obtain a reference current Iref having a zero or substantially zero temperature coefficient and a reference voltage Vref having a temperature coefficient in the range of ±100 ppm/° C. Further, it is also possible to set through laser trimming the temperature coefficient of the reference voltage Vref to approximately ±50 ppm/° C., which is half the temperature coefficient of silicon chrome, thereby obtaining the reference current Iref and reference voltage Vref having a temperature coefficient in the range of ±50 ppm/° C. Choice may be made according to the usage. Even when adjustment is made through laser trimming, the temperature coefficient of a resistor made of silicon chrome is ±100 ppm/° C., as opposed to a temperature coefficient of −2000 ppm/° C. to −3000 ppm/° C. achieved by a resistor made of polysilicon. Because of this, the circuit for trimming can be made smaller, which contributes to avoiding an increase in circuit size.

The advantages described above in [1] and [2] are also achieved by a constant current generating circuit 200, 300, or 400, which will be described in the following as a variation of the constant current generating circuit 100.

(4) Variation of Constant Current Generating Circuit

Figure 13:
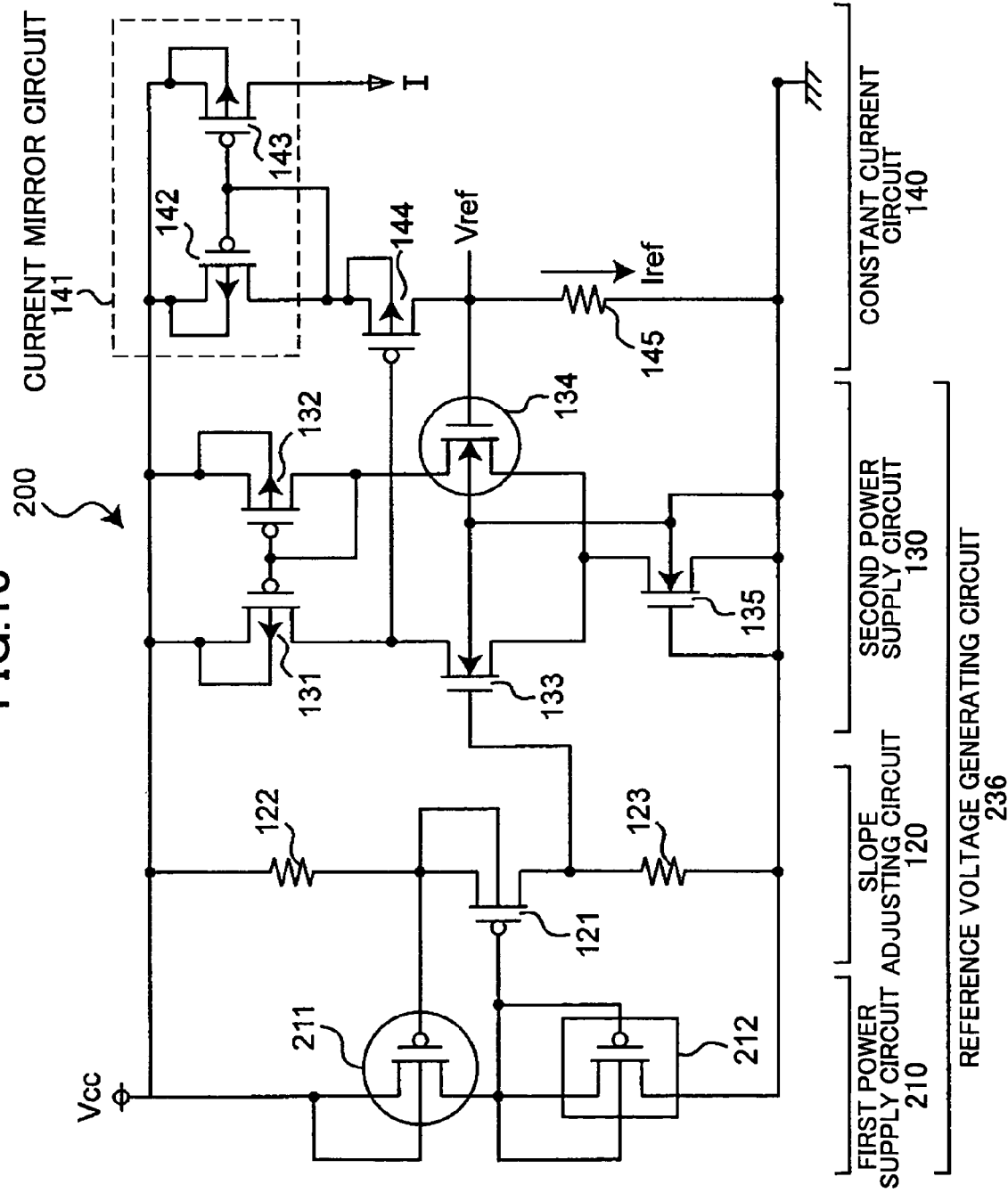
FIG. 13 is a drawing showing the circuit configuration of a variation of the constant current generating circuit.
Figure 14:
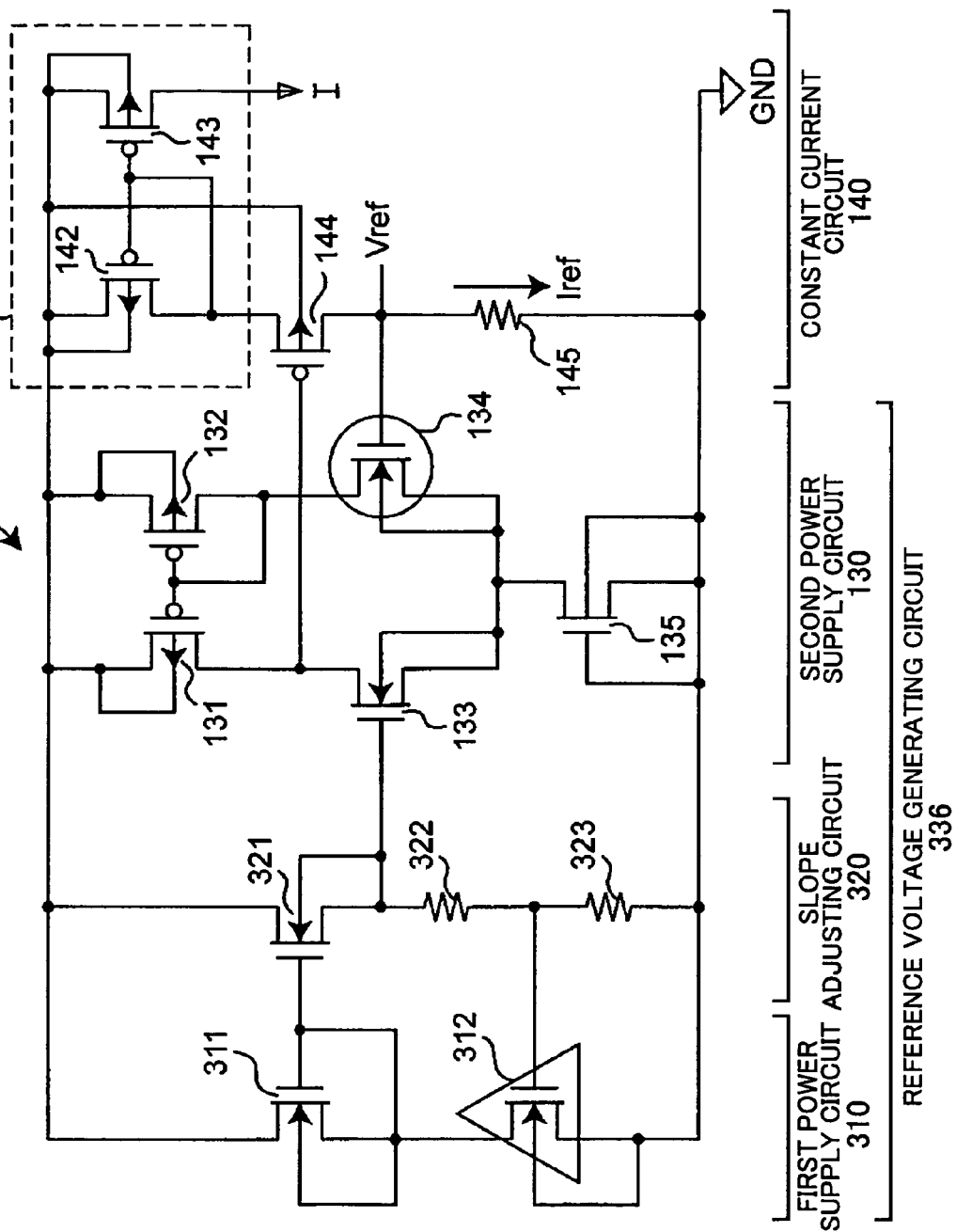
FIG. 14 is a drawing showing the circuit configuration of another variation of the constant current generating circuit.
Figure 15:
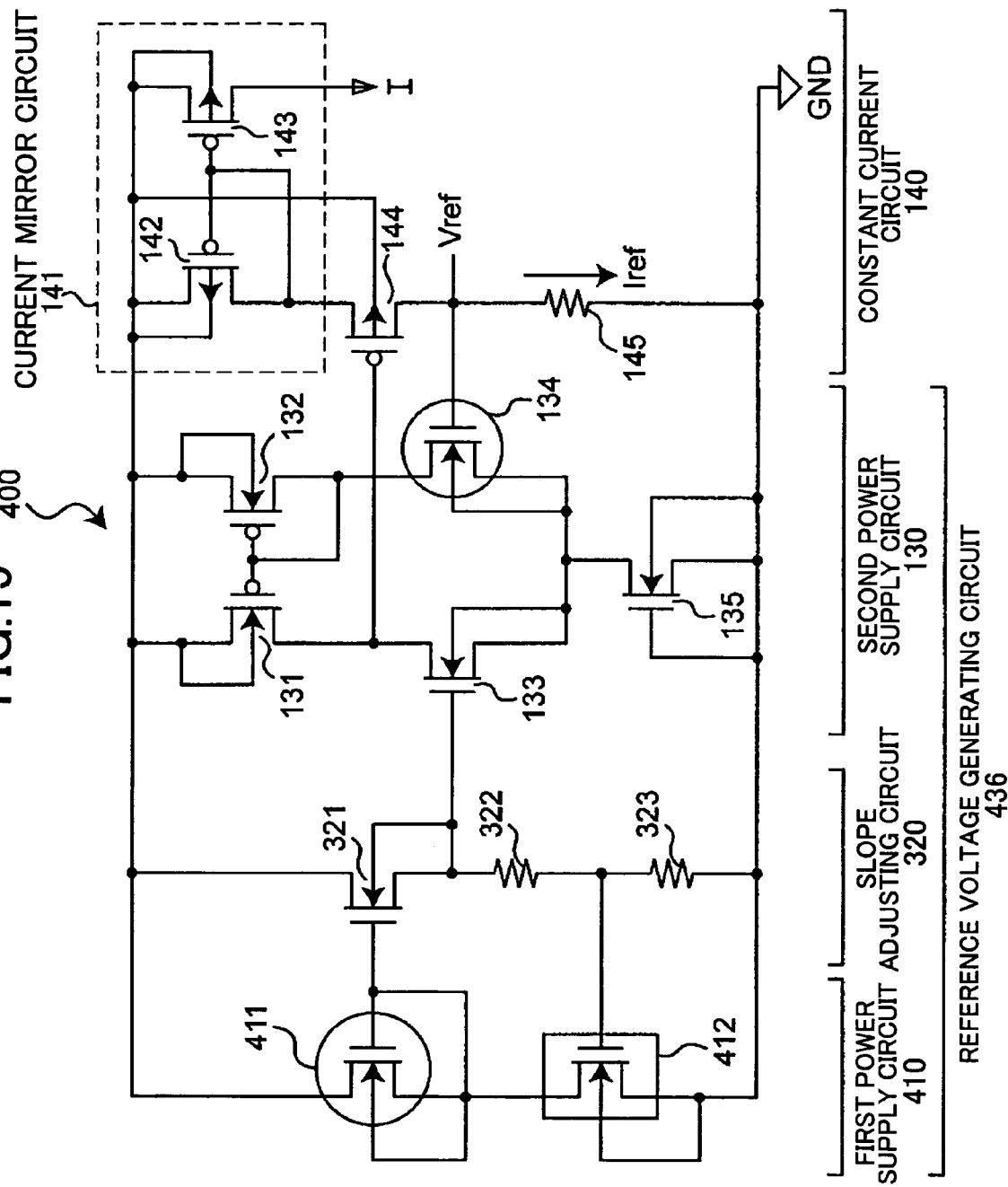
FIG. 15 is a drawing showing the circuit configuration of a further variation of the constant current generating circuit.

FIG. 13 through FIG. 15 are drawings showing the constant current generating circuits 200, 300, and 400, respectively, which are variations of the constant current generating circuit 100.

FIG. 13 is a drawing showing the circuit configuration of the constant current generating circuit 200. The constant current generating circuit 200 is a variation of the constant current generating circuit 100 shown in FIG. 1, and has a configuration in which transistors used in the first power supply circuit are changed. The same elements as those of the constant current generating circuit 100 are referred to by the same reference numerals.

A first power supply circuit 210 provided in the constant current generating circuit 200 includes a p-channel-type FET 211 having a p-type gate doped with high density impurity and a p-channel-type FET 212 having a p-type gate doped with low density impurity. The FET 211 and the FET 212 are connected in series. Like the first power supply circuit 110 provided in the constant current generating circuit 100, the first power supply circuit 210 exhibits a positive temperature coefficient in relation to a change in ambient temperature. The function of a reference voltage generating circuit 236 comprised of the first power supply circuit 210, the slope adjusting circuit 120, and the second power supply circuit 130 and the function of the constant current circuit 140 are the same as those of the constant current generating circuit 100.

FIG. 14 is a drawing showing the circuit configuration of the constant current generating circuit 300. The constant current generating circuit 300 is a variation of the constant current generating circuit 100 shown in FIG. 1, and is implemented on an n-type substrate. Main differences include the use of n-channel-type FETs in a first power supply circuit 310 and the construction of a slope adjusting circuit 320 that differs from the construction of the slope adjusting circuit 120 provided in the constant current generating circuit 100. The same elements as those of the constant current generating circuit 100 are referred by the same reference numerals.

The first power supply circuit 310 includes an n-channel-type FET 311 having an n-type gate doped with high density impurity and an n-channel-type FET 312 having an n-type gate doped with low density impurity. The FET 311 and the FET 312 are connected in series. The first power supply circuit 310 has a positive temperature coefficient in relation to a change in ambient temperature coefficient.

The slope adjusting circuit 320 is comprised of an n-channel-type FET 321 having an n-type gate doped with high density impurity and two resistors 322 and 323 connected in series.

The function of a reference voltage generating circuit 336 comprised of the first power supply circuit 310, the slope adjusting circuit 320, and the second power supply circuit 130 and the function of the constant current circuit 140 are the same as those of the constant current generating circuit 100.

FIG. 15 is a drawing showing the circuit configuration of the constant current generating circuit 400. The constant current generating circuit 400 is a variation of the constant current generating circuit 100 shown in FIG. 1, and has a configuration in which transistors used in the first power supply circuit have a different combination. The same elements as those of the constant current generating circuit 100 are referred to by the same reference numerals.

A first power supply circuit 410 provided in the constant current generating circuit 400 includes an n-channel-type FET 411 having a p-type gate doped with high density impurity and an n-channel-type FET 412 having a p-type gate doped with low density impurity. The FET 411 and the FET 412 are connected in series. Like the first power supply circuit 110 provided in the constant current generating circuit 100, the first power supply circuit 410 exhibits a positive temperature coefficient in relation to a change in ambient temperature. The function of a reference voltage generating circuit 436 comprised of the first power supply circuit 410, the slope adjusting circuit 320, and the second power supply circuit 130 and the function of the constant current circuit 140 are the same as those of the constant current generating circuit 100.

The constant current generating circuits 200, 300, and 400 serving as variations as described above have the same advantages as the constant current generating circuit 100 of the first embodiment.

Further, the present invention is not limited to these embodiments, but various variations and modifications may be made without departing from the scope of the present invention.

The present application is based on Japanese priority application No. 2004-138300 filed on May 7, 2004, with the Japanese Patent Office, the entire contents of which are hereby incorporated by reference.

What is claimed is:

1. A circuit for generating a constant current, comprising:
   a reference voltage generating circuit configured to generate a reference voltage; and
   a constant current circuit including one or more resistors configured to determine an amount of an electric current generated in response to the reference voltage, said one or more resistors being formed of a metal thin film,
   wherein said reference voltage generating circuit includes:

a first power supply circuit configured to produce a first voltage having a positive temperature coefficient, said first power supply circuit including a plurality of field-effect transistors having respective gates, said gates having a common conduction type and different impurity densities, a slope adjusting circuit configured to adjust the positive temperature coefficient of the first voltage produced by said first power supply circuit, said slope adjusting circuit including a field effect transistor and at least one resistor, and a second power supply circuit configured to produce a second voltage having a negative temperature coefficient, to add the second voltage to the first voltage having the temperature coefficient thereof adjusted by said slope adjusting circuit, and thereby to produce the reference voltage having a substantially zero temperature coefficient, said second power supply circuit including a plurality of field-effect transistors having respective gates having different conduction types.

2. The circuit as claimed in claim 1, wherein said at least one resistor of said slope adjusting circuit is formed of a metal thin film.

3. The circuit as claimed in claim 1, wherein the metal thin film is made of silicon chrome.

4. The circuit as claimed in claim 1, wherein said one or more resistors being formed of a metal thin film include:

a wiring pattern; and an insulating film formed on said wiring pattern and configured to have a contact hole at a connection point of said wiring pattern, wherein said metal thin film is coupled through an ohmic contact to the connection point of said wiring pattern via the contact hole.

5. The circuit as claimed in claim 4, wherein no natural oxide film is in existence on an inner wall of the contact hole and on a surface of said wiring pattern at a bottom of the contact hole.

6. The circuit as claimed in claim 4, further comprising a refractory metal film deposited between said metal thin film and the connection point of said wiring pattern.

7. The circuit as claimed in claim 4, wherein said wiring pattern includes:

a metal material pattern; and a refractory metal film formed on said metal material pattern.

8. The circuit as claimed in claim 4, wherein said wiring pattern includes:

a polysilicon pattern; and a refractory metal film formed on said polysilicon pattern.

9. The circuit as claimed in claim 1, wherein the plurality of field-effect transistors of said second power supply circuit include:

a first field-effect transistor having an n-type gate; and a second field-effect transistor having a p-type gate, said first field-effect transistor and said second field-effect transistor being connected in series.

10. The circuit as claimed in claim 1, wherein the plurality of field-effect transistors of said first power supply circuit include:

a first field-effect transistor having a p-type gate doped with impurity at first density; and a second field-effect transistor having a p-type gate doped with impurity at second density different from the first density, said first field-effect transistor and said second field-effect transistor being connected in series.

11. The circuit as claimed in claim 1, wherein the plurality of field-effect transistors of said first power supply circuit include:

a first field-effect transistor having an n-type gate doped with impurity at first density; and a second field-effect transistor having an n-type gate doped with impurity at second density different from the first density, said first field-effect transistor and said second field-effect transistor being connected in series.

* * * * *